(12) United States Patent
Miyake

(10) Patent No.: US 7,932,888 B2
(45) Date of Patent: Apr. 26, 2011

(54) PULSE OUTPUT CIRCUIT, SHIFT REGISTER, AND DISPLAY DEVICE

(75) Inventor: Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 701 days.

(21) Appl. No.: 11/871,704

(22) Filed: Oct. 12, 2007

(65) Prior Publication Data

US 2008/0258998 A1  Oct. 23, 2008

(30) Foreign Application Priority Data

Oct. 17, 2006  (JP) ................. 2006-282931

(51) Int. Cl.
*G09G 3/36* (2006.01)
(52) U.S. Cl. ........................................ 345/100; 345/42
(58) Field of Classification Search .............. 345/98, 345/100, 60, 87, 42, 204, 690
See application file for complete search history.

(56) References Cited

U.S. PATENT DOCUMENTS

| | | | |
|---|---|---|---|
| 4,430,737 A * | 2/1984 | Beranger et al. .............. 714/801 |
| 5,434,899 A | 7/1995 | Huq et al. | |
| 5,701,136 A | 12/1997 | Huq et al. | |
| 5,859,630 A | 1/1999 | Huq | |
| 5,949,271 A | 9/1999 | Fujikura | |
| 6,064,713 A | 5/2000 | Lebrun et al. | |
| 6,204,789 B1 * | 3/2001 | Nagata ........................... 341/144 |
| 6,300,928 B1 | 10/2001 | Kim | |
| 6,306,694 B1 | 10/2001 | Yamazaki et al. | |
| 6,690,347 B2 | 2/2004 | Jeon et al. | |
| 6,788,108 B2 | 9/2004 | Miyake et al. | |
| 6,813,332 B2 | 11/2004 | Nagao et al. | |
| 6,928,136 B2 | 8/2005 | Nagao et al. | |
| 6,958,750 B2 | 10/2005 | Azami et al. | |
| 6,975,142 B2 | 12/2005 | Azami et al. | |
| 6,989,805 B2 | 1/2006 | Inukai | |
| 7,057,598 B2 | 6/2006 | Azami et al. | |
| 7,091,749 B2 | 8/2006 | Miyake et al. | |
| 7,116,748 B2 * | 10/2006 | Nagao et al. ..................... 377/79 |
| 7,151,278 B2 | 12/2006 | Nagao et al. | |

(Continued)

FOREIGN PATENT DOCUMENTS

EP  1 253 718 A1  10/2002

(Continued)

OTHER PUBLICATIONS

Lee, Y et al., "16.2: Advaced TFT-LCD Data Line Reduction Method," SID Digest '06: SID International Symposium Digest of Technical Papers, Jun. 6, 2006, vol. 37, pp. 1083-1086.

*Primary Examiner* — Ricardo L Osorio
(74) *Attorney, Agent, or Firm* — Fish & Richardson P.C.

(57) ABSTRACT

An object is to suppress change of a threshold voltage of a transistor in a shift register and to prevent the transistor from malfunctioning during a non-selection period. A pulse output circuit provided in the shift register regularly supplies a potential to a gate electrode of a transistor which is in a floating state so that the gate electrode is turned on during a non-selection period when a pulse is not outputted. In addition, supply of a potential to the gate electrode of the transistor is performed by turning on or off another transistor regularly.

24 Claims, 15 Drawing Sheets

U.S. PATENT DOCUMENTS

| | | |
|---|---|---|
| 7,362,139 B2 | 4/2008 | Miyake et al. |
| 7,394,102 B2 | 7/2008 | Nagao et al. |
| 7,460,099 B2 * | 12/2008 | Kubota et al. .................. 345/98 |
| 7,522,145 B2 | 4/2009 | Lee et al. |
| 7,586,478 B2 | 9/2009 | Azami et al. |
| RE41,215 E | 4/2010 | Miyake et al. |
| 7,710,384 B2 | 5/2010 | Azami et al. |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |
| 2003/0111677 A1 | 6/2003 | Miyake |
| 2004/0008193 A1 * | 1/2004 | Yu ................................ 345/204 |
| 2004/0041752 A1 | 3/2004 | Kimura |
| 2006/0280279 A1 | 12/2006 | Nagao et al. |
| 2008/0174589 A1 | 7/2008 | Nagao et al. |
| 2010/0073348 A1 | 3/2010 | Azami et al. |

FOREIGN PATENT DOCUMENTS

| | | |
|---|---|---|
| JP | 2002-328643 A | 11/2002 |
| JP | 2002-335153 | 11/2002 |
| JP | 2003-101394 A | 4/2003 |
| JP | 2004-226429 | 8/2004 |

* cited by examiner 2010, 2020, 2030, 2040, 2050, 2060: TFTs
2070 : capacitor
2100 : first amplitude compensation citcuit
2200 : second amplitude compensation citcuit 1010, 1020, 1030, 1040, 1050, 1060: TFTs
1070 : capacitor
1100 : first amplitude compensation citcuit
1200 : second amplitude compensation citcuit

PULSE OUTPUT CIRCUIT, SHIFT REGISTER, AND DISPLAY DEVICE

BACKGROUND OF THE INVENTION

1. Field of the Invention

The present invention relates to a pulse output circuit, a shift register, and a display device, a semiconductor device, and an electronic device each of the devices having the shift register, particularly relates to a pulse output circuit, a shift register, and a display device, a semiconductor device, and an electronic device each having a thin film transistor (TFT) having one conductivity type.

2. Description of the Related Art

In recent years, a display device in which a circuit is formed using a thin film transistor (hereinafter also referred to as a TFT) that is formed using a semiconductor thin film over an insulator, particularly over a glass substrate or a plastic substrate has been developed, particularly an active matrix display device has been developed. An active matrix display device formed by using a TFT has several hundreds of thousands to several millions of pixels which are arranged in matrix, and an image is displayed by controlling the charge of each pixel with the TFT arranged in each pixel.

In addition, as a recent technique, a method in which a driver circuit is formed by using a TFT in the peripheral region of a pixel portion at the same time as a pixel TFT which forms a pixel has been developed. Such a method contributes greatly to reduction in the size and weight and low power consumption of a device, and along with this, a TFT is an essential device for a display portion and the like of a mobile information terminal of which an applicable field has been significantly expanded in recent years.

In general, as a circuit which forms a driver circuit of a display device, a CMOS circuit in which an N-channel TFT and a P-channel TFT are combined is used. As features of the CMOS circuit, the following can be given: one feature is that power consumption in the whole circuit can be suppressed to a very low level because current flows only at the moment when a logic is changed (from an H (High) level to an L (Low) level, or from an L level to an H level) and current does not flow ideally (actually, there is minute leakage current) while a certain logic is held, and another feature is that high speed operation is possible because TFTs having different polarities operate complementarily.

However, in consideration of manufacturing steps, since an ion doping process or the like of the CMOS circuit is complicated, a large number of manufacturing steps have an effect on production cost directly. Thus, a circuit is proposed, which is formed using a unipolar TFT that is either an N-channel TFT or a P-channel TFT instead of a CMOS circuit that is conventionally used, and which achieves high speed operation equivalent to the CMOS circuit (e.g., refer to Reference 1: Japanese Published Patent Application No. 2002-335153).

As shown in FIGS. 7A to 7C, in a circuit described in Reference 1, when a gate electrode of a TFT 2050 which is electrically connected to an output terminal is made to be in a floating state temporarily, a potential of the gate electrode can be set as a potential which is higher than a power supply potential by using capacitive coupling between the gate and a source of the TFT 2050. As a result, an output without amplitude attenuation can be obtained without generating a voltage drop due to a threshold value of the TFT 2050. Reference numerals 2010, 2020, 2030, 2040, and 2060 are TFTs. Reference numeral 2070 is a capacitor. Reference numeral 2100 is a first amplitude compensation circuit and reference numeral 2200 is a second amplitude compensation circuit.

Such operation in the TFT 2050 is referred to as bootstrap operation. With this operation, an output pulse can be obtained without generating a voltage drop due to the threshold value of the TFT.

In addition, in the circuit illustrated in FIGS. 7A to 7C, both gate electrodes of the TFT 2050 and a TFT 2060 are in a floating state during the period when there is no input and output of a pulse, so that a potential change, such as noise, occurs in a node α. However, in order to solve this problem, a circuit (see FIGS. 8A to 8C) is proposed in which noise generated in the node α is reduced when a TFT 1020 and a TFT 1060 are turned on and are in a floating state during the period when there is no input and output of a pulse (e.g., see Reference 2: Japanese Published Patent Application No. 2004-226429). Reference numerals 1010, 1030, 1040, and 1050 are TFTs. Reference numeral 1070 is a capacitor. Reference numeral 1100 is a first amplitude compensation circuit and reference numeral 1200 is a second amplitude compensation circuit.

SUMMARY OF THE INVENTION

In FIGS. 8A to 8C, when attention is focused on an SROut1, CK1 varies from an H level to an L level after a pulse is outputted. Along with this, a potential of the SROut1 begins to decrease. On the other hand, a similar operation to the above-described operation is also performed in a second stage at timing when CK2 becomes an H level, and a pulse is outputted to an SROut2. This pulse is inputted to an input terminal 3 in a first stage, and a TFT 1030 is turned on. Accordingly, potentials of gate electrodes of the TFT 1020 and the TFT 1060 increase and the TFT 1020 and the TFT 1060 are turned on. Along with this, a potential of a gate electrode of a TFT 1050 and a potential of the SROut1 decrease. Then, when an output of the SROut2 changes from an H level to an L level, the TFT 1030 is turned off. Accordingly, the gate electrodes of the TFT 1020 and the TFT 1060 are in a floating state at this moment. After that, this state continues until the next SP is inputted in the first stage.

In this way, in the circuit of FIGS. 8A and 8B, a node β is in a floating state during the period when there is no input and output of a pulse. For example, in the case where the circuit of FIGS. 8A and 8B is used as a scan driver, a potential of the node β needs to be held during about one frame. Since channel widths of a TFT 1040 and the TFT 1060 relatively increase, off-current also increases. At this time, the potential of the node β may decrease due to the off-current of the TFT 1040 and the TFT 1060, and the TFT 1060 may be turned off in some cases. As a result, a circuit has a possibility of malfunction due to capacitive coupling with a clock signal.

In addition, when a pulse is outputted from the TFT 1050, the node β is in a floating state. Therefore, when a potential of a node y rises from an L level to an H level, the potential of the node β increases due to capacitive coupling in some cases. As a result of this, there is a possibility that the TFT 1020 may be turned on and malfunction may occur. Since this potential change is much smaller than normal pulse amplitude, this potential change does not become a problem as long as the potential change is smaller than a threshold value of the TFT 1020. However, when the potential change is larger than the threshold value of the TFT 1020, malfunction may occur because the potential of the node a decreases. In particular, when amorphous silicon is used for a TFT, a nitride film is often used as a gate insulating film, and a threshold value changes in some cases. As a result of this, there is a high possibility that a pulse output circuit may malfunction.

When amorphous silicon is used for a TFT, compared with a TFT using polysilicon, sufficient drive capability is difficult to be obtained because of inferior electric characteristics and a threshold value shifts due to a voltage condition. Accordingly, a problem is a circuit technique to form a driver circuit which drives a pixel by using a TFT which uses amorphous silicon.

An object of the present invention disclosed in this specification is to provide a pulse output circuit, a shift register, and a display device each of which reduces malfunction in a circuit and assures further reliable operation by solving one or a plurality of such problems.

A pulse output circuit of the present invention regularly supplies a potential to a gate electrode of a transistor which is in a floating state so that the gate electrode is turned on during a non-selection period when a pulse is not outputted. In addition, supply of a potential to the gate electrode of the transistor is performed by turning on or off another transistor regularly.

In addition, a shift register of the present invention is driven so that a pulse outputted from an m-th pulse output circuit overlaps half (½ period) of a pulse outputted from a (m+1)th pulse output circuit. Hereinafter, specific structures of the shift register and the pulse output circuit of the present invention will be described.

A shift register of the present invention includes a plurality of pulse output circuits including at least a (m−2)th pulse output circuit, a (m−1)th pulse output circuit, an m-th pulse output circuit, a (m+1)th pulse output circuit, and a (m+2)th pulse output circuit (m≧3); and first to fourth signal lines each of which outputs a clock signal, in which each of the pulse output circuits includes first to sixth input terminals and an output terminal; the first to third input terminals of the m-th pulse output circuit are electrically connected to any of the first to fourth signal lines; the fourth input terminal of the m-th pulse output circuit is electrically connected to the output terminal of the (m−2)th pulse output circuit; the fifth input terminal of the m-th pulse output circuit is electrically connected to the output terminal of the (m−1)th pulse output circuit; the sixth input terminal of the m-th pulse output circuit is electrically connected to the output terminal of the (m+2)th pulse output circuit; and the output terminal of the m-th pulse output circuit is electrically connected to the sixth input terminal of the (m−2)th pulse output circuit, the fifth input terminal of the (m+1)th pulse output circuit, and the fourth input terminal of the (m+2)th pulse output circuit.

A pulse output circuit of the present invention includes first to ninth transistors, in which a first electrode of the first transistor is electrically connected to a first power supply line, a second electrode of the first transistor is electrically connected to a gate electrode of the third transistor, and a gate electrode of the first transistor is electrically connected to a fourth input terminal; a first electrode of the second transistor is electrically connected to a second power supply line, a second electrode of the second transistor is electrically connected to the gate electrode of the third transistor, and a gate electrode of the second transistor is electrically connected to a gate electrode of the fourth transistor; a first electrode of the third transistor is electrically connected to a first input terminal and a second electrode of the third transistor is electrically connected to an output terminal; a first electrode of the fourth transistor is electrically connected to a third power supply line and a second electrode of the fourth transistor is electrically connected to the output terminal; a first electrode of the fifth transistor is electrically connected to a fourth power supply line, a second electrode of the fifth transistor is electrically connected to the gate electrode of the second transistor and the gate electrode of the fourth transistor, and a gate electrode of the fifth transistor is electrically connected to the fourth input terminal; a first electrode of the sixth transistor is electrically connected to the fourth power supply line, a second electrode of the sixth transistor is electrically connected to the gate electrode of the second transistor and the gate electrode of the fourth transistor, and a gate electrode of the sixth transistor is electrically connected to a fifth input terminal; a first electrode of the seventh transistor is electrically connected to a fifth power supply line, a second electrode of the seventh transistor is electrically connected to the gate electrode of the second transistor and the gate electrode of the fourth transistor, and a gate electrode of the seventh transistor is electrically connected to a sixth input terminal; a first electrode of the eighth transistor is electrically connected to the fifth power supply line, a second electrode of the eighth transistor is electrically connected to a second electrode of the ninth transistor, and a gate electrode of the eighth transistor is electrically connected to a second input terminal; and a first electrode of the ninth transistor is electrically connected to the gate electrode of the second transistor and the gate electrode of the fourth transistor, and a gate electrode of the ninth transistor is electrically connected to a third input terminal.

A display device of the present invention includes a pixel; and a shift register to drive the pixel, in which the shift register includes a plurality of pulse output circuits including at least a (m−2)th pulse output circuit, a (m−1)th pulse output circuit, an m-th pulse output circuit, a (m+1)th pulse output circuit, and a (m+2)th pulse output circuit (m≧3); and first to fourth signal lines each of which outputs a clock signal, and each of the pulse output circuits includes first to sixth input terminals and an output terminal; the first to third input terminals of the m-th pulse output circuit are electrically connected to any of the first to fourth signal lines; the fourth input terminal of the m-th pulse output circuit is electrically connected to the output terminal of the (m−2)th pulse output circuit; the fifth input terminal of the m-th pulse output circuit is electrically connected to the output terminal of the (m−1)th pulse output circuit; the sixth input terminal of the m-th pulse output circuit is electrically connected to the output terminal of the (m+2)th pulse output circuit; and the output terminal of the m-th pulse output circuit is electrically connected to the sixth input terminal of the (m−2)th pulse output circuit, the fifth input terminal of the (m+1)th pulse output circuit, and the fourth input terminal of the (m+2)th pulse output circuit.

In accordance with the present invention, by regularly supplying a potential to a gate electrode of a transistor which is in a floating state during a non-selection period when an input and output of a pulse is not performed, malfunction of a pulse output circuit can be suppressed.

In addition, by using a driving method in which a pulse outputted from the m-th pulse output circuit overlaps half (½ period) of a pulse outputted from the (m+1)th pulse output circuit, the present invention can provide a pulse output circuit which can withstand large load and operate at high frequency.

DETAILED DESCRIPTION OF THE INVENTION

Figure 1A:
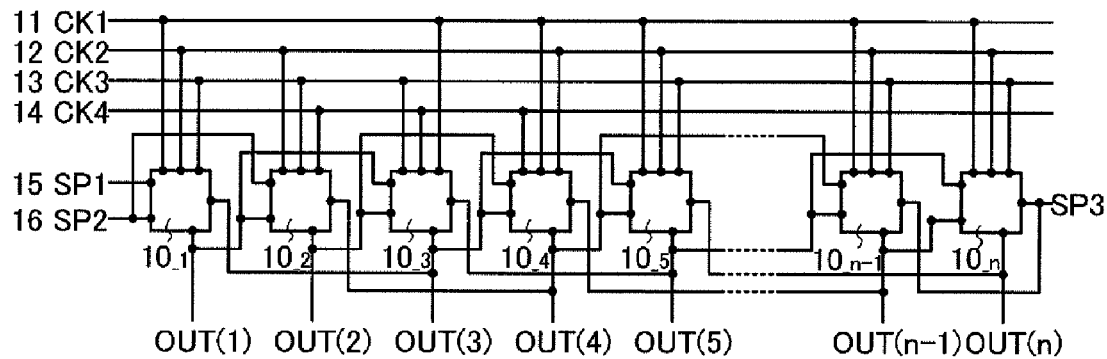
FIG. 1A is a diagram showing an example of a shift register of the present invention.

Hereinafter, embodiment modes of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment modes. Note that the same reference numeral is commonly used to denote the same component among different drawings in structures of the present invention explained below.

Embodiment Mode 1

In this embodiment mode, an example of a pulse output circuit of the present invention and a shift register including the pulse output circuit will be described with reference to drawings.

A shift register shown in this embodiment mode includes first to n-th pulse output circuits $10\_1$ to $10\_n$ ($n \geq 3$) and first to fourth signal lines 11 to 14 each of which outputs a clock signal (see FIG. 1A). The first signal line 11 outputs a first clock signal (CK1), the second signal line 12 outputs a second clock signal (CK2), the third signal line 13 outputs a third clock signal (CK3), and the fourth signal line 14 outputs a fourth clock signal (CK4).

The clock signals (CK) are signals which alternate between an H (High) signal and an L (Low) signal at a regular interval, and here, the first to fourth clock signals (CK1) to (CK4) are delayed for ½ period sequentially. In this embodiment mode, by using the first to fourth clock signals (CK1) to (CK4), control or the like of driving of a pulse output circuit is performed.

Figure 1B:
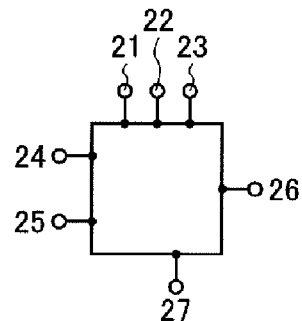
FIGS. 1B and 1C are diagrams each showing an example of a pulse output circuit of the present invention.

Each of the first to n-th pulse output circuits $10\_1$ to $10\_n$ includes a first input terminal 21, a second input terminal 22, a third input terminal 23, a fourth input terminal 24, a fifth input terminal 25, a sixth input terminal 26, and an output terminal 27 (see FIG. 1B).

The first input terminal 21, the second input terminal 22, and the third input terminal 23 are electrically connected to any of the first to fourth signal lines 11 to 14. For example, in FIGS. 1A to 1C, the first input terminal 21 of the first pulse output circuit $10\_1$ is electrically connected to the first signal line 11, the second input terminal 22 of the first pulse output circuit $10\_1$ is electrically connected to the second signal line 12, and the third input terminal 23 of the first pulse output circuit $10\_1$ is electrically connected to the third signal line 13. In addition, the first input terminal 21 of the second pulse output circuit $10\_2$ is electrically connected to the second signal line 12, the second input terminal 22 of the second pulse output circuit $10\_2$ is electrically connected to the third signal line 13, and the third input terminal 23 of the second pulse output circuit $10\_2$ is electrically connected to the fourth signal line 14.

In the m-th pulse output circuit ($m \geq 3$) of the shift register shown in this embodiment mode, the fourth input terminal 24 of the m-th pulse output circuit is electrically connected to the output terminal 27 of the (m−2)th pulse output circuit and the fifth input terminal 25 of the (m−1)th pulse output circuit. The fifth input terminal 25 of the m-th pulse output circuit is electrically connected to the output terminal 27 of the (m−1)th pulse output circuit and the fourth input terminal 24 of the (m+1)th pulse output circuit. The sixth input terminal 26 of the m-th pulse output circuit is electrically connected to the output terminal 27 of the (m+2)th pulse output circuit. The output terminal 27 of the m-th pulse output circuit is electrically connected to the sixth input terminal 26 of the (m−2)th pulse output circuit, the fifth input terminal 25 of the (m+1)th pulse output circuit, and the fourth input terminal 24 of the (m+2)th pulse output circuit, and outputs a signal to OUT(m).

For example, in the third pulse output circuit $10\_3$, the fourth input terminal 24 is electrically connected to the output terminal of the first pulse output circuit $10\_1$ and the fifth input terminal of the second pulse output circuit $10\_2$. The fifth input terminal 25 of the third pulse output circuit $10\_3$ is electrically connected to the output terminal of the second pulse output circuit $10\_2$ and the fourth input terminal of the fourth pulse output circuit $10\_4$. The sixth input terminal 26 of the third pulse output circuit $10\_3$ is electrically connected to the output terminal of the fifth pulse output circuit $10\_5$. The output terminal of the third pulse output circuit $10\_3$ is electrically connected to the sixth input terminal of the first pulse output circuit $10\_1$, the fifth input terminal of the fourth pulse output circuit 104, and the fourth input terminal of the fifth pulse output circuit $10\_5$. In addition, in the third pulse output circuit $10\_3$, a signal outputted from the output terminal of the first pulse output circuit $10\_1$ is inputted to the fourth input terminal 24 of the third pulse output circuit $10\_3$. A signal outputted from the output terminal of the second pulse output circuit $10\_2$ is inputted to the fifth input terminal 25 of the third pulse output circuit $10\__3$. A signal outputted from the output terminal of the fifth pulse output circuit $10\__5$ is inputted to the sixth input terminal 26 of the third pulse output circuit $10\__3$. A signal outputted from the output terminal 27 of the third pulse output circuit 103 is inputted to the sixth input terminal of the first pulse output circuit $10\__1$, the fifth input terminal of the fourth pulse output circuit $10\__4$, and the fourth input terminal of the fifth pulse output circuit $10\__5$.

In addition, a first start pulse (SP1) is inputted to the fourth input terminal 24 of the first pulse output circuit, and a second start pulse (SP2) is inputted to the fifth input terminal 25 of the first pulse output circuit.

Next, a specific structure of each of the first to n-th pulse output circuits $10\__1$ to $10\__n$ will be described.

Figure 1C:
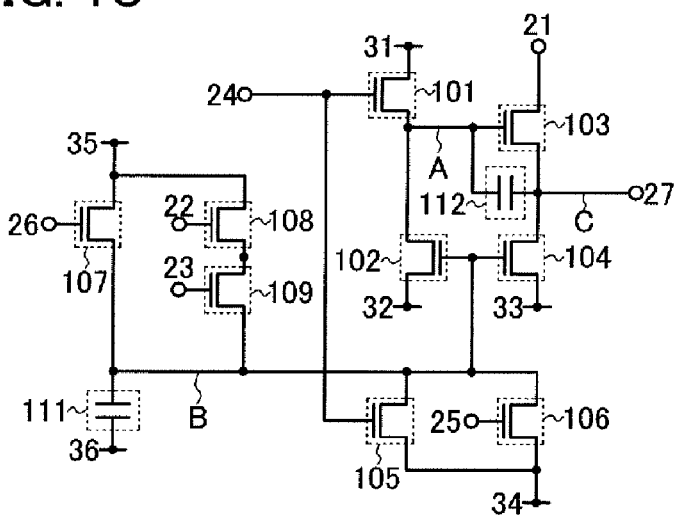
Figure 2:
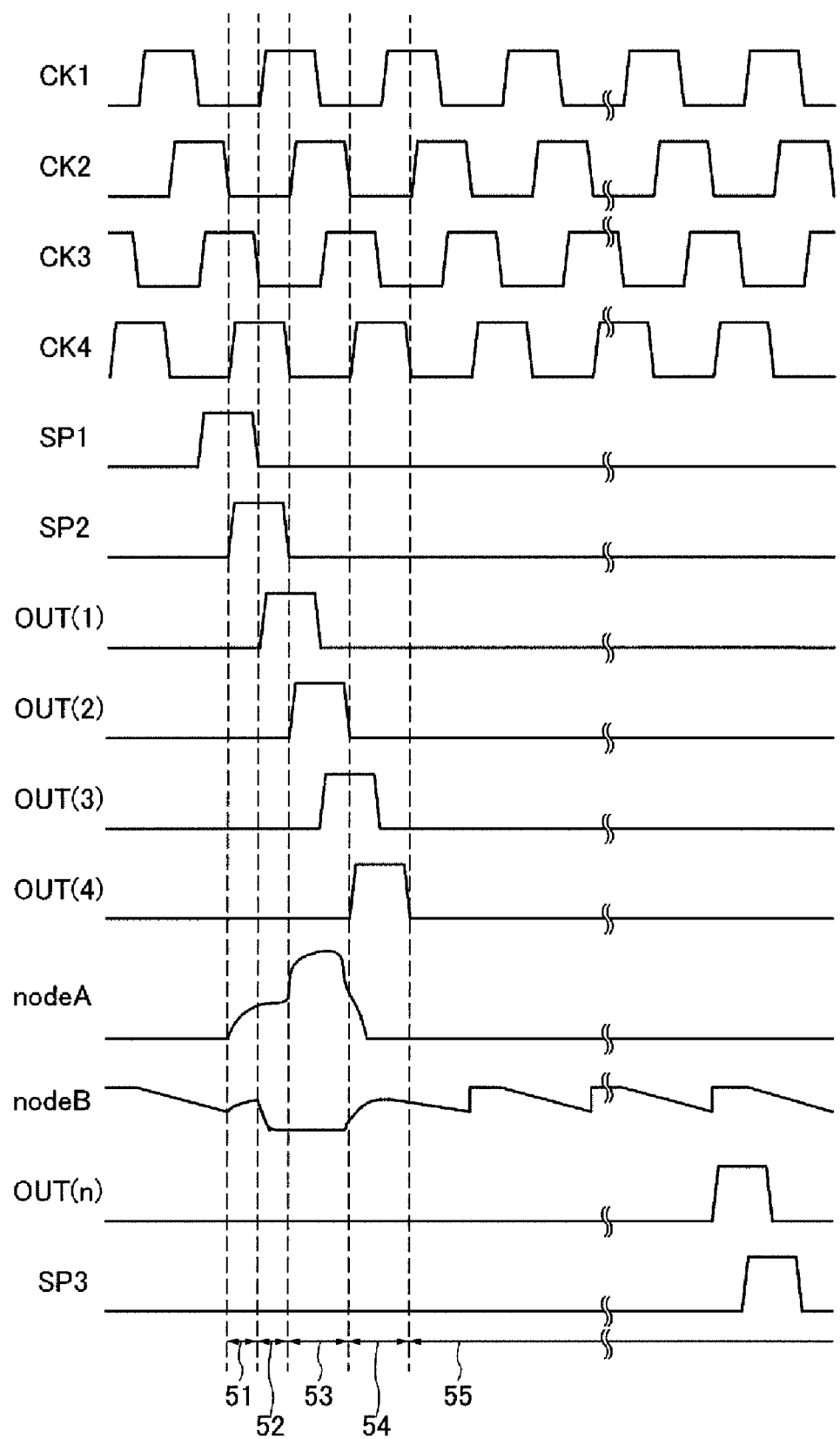
FIG. 2 is a diagram showing an operation example of a pulse output circuit of the present invention.
Figure 3B:
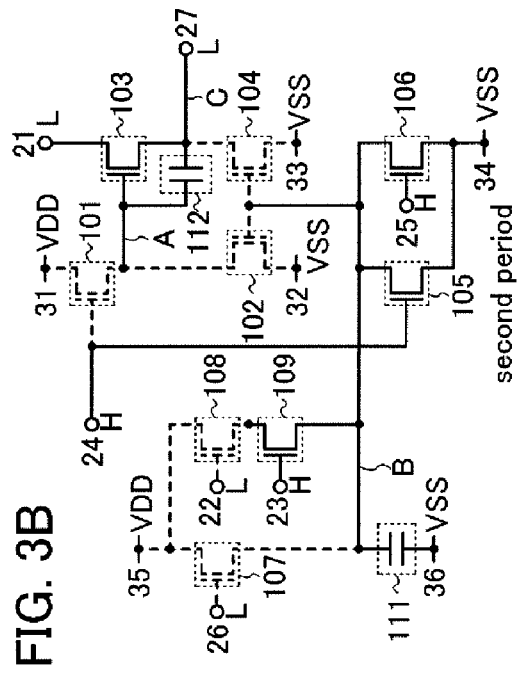
FIGS. 3A to 3D are diagrams each showing an operation example of a pulse output circuit of the present invention.
Figure 3D:
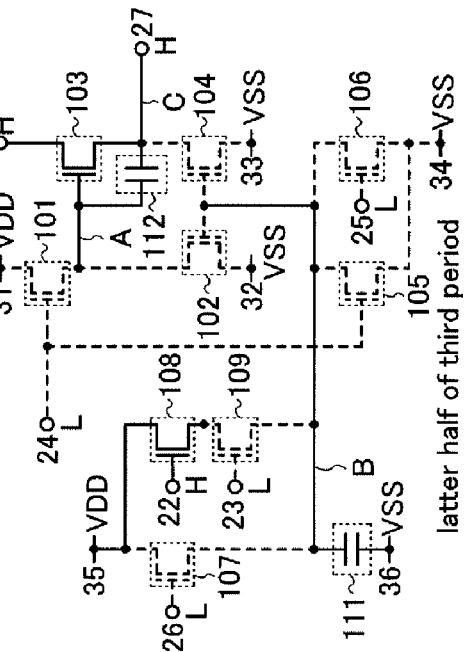
Figure 3A:
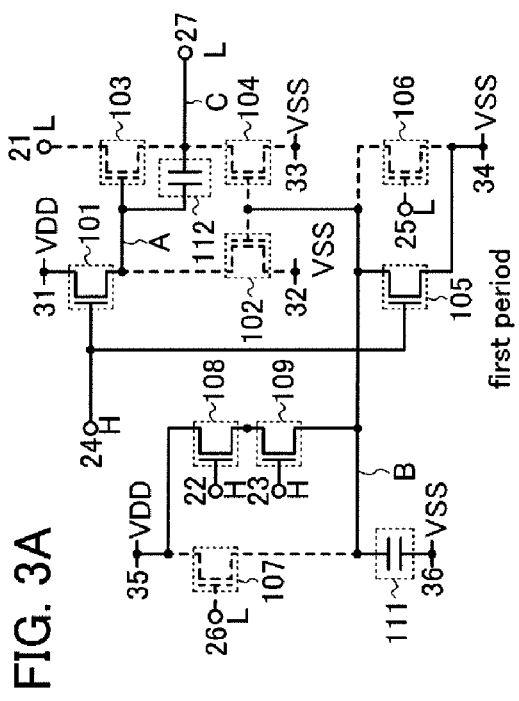
Figure 3C:
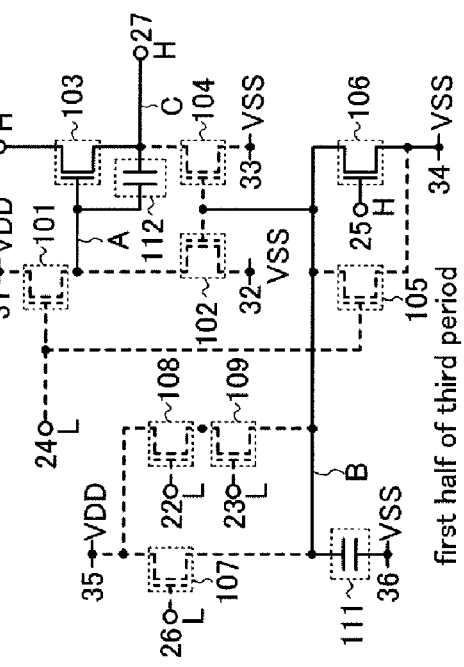

Each of the first to n-th pulse output circuits $10\__1$ to $10\__n$ includes first to ninth transistors 101 to 109, a first capacitor 111, and a second capacitor 112 (see FIG. 1C). Further, signals are supplied to the first to ninth transistors 101 to 109 from first to sixth power supply lines 31 to 36, in addition to the first to sixth input terminals 21 to 26 and the output terminal 27.

A first electrode (either one of a source electrode or a drain electrode) of the first transistor 101 is electrically connected to the first power supply line 31, a second electrode (the other one of the source electrode or the drain electrode) of the first transistor 101 is electrically connected to a gate electrode of the third transistor 103 and a second electrode of the second capacitor 112, and a gate electrode of the first transistor 101 is electrically connected to the fourth input terminal 24. A first electrode of the second transistor 102 is electrically connected to the second power supply line 32, a second electrode of the second transistor 102 is electrically connected to the gate electrode of the third transistor 103, and a gate electrode of the second transistor 102 is electrically connected to a gate electrode of the fourth transistor 104. A first electrode of the third transistor 103 is electrically connected to the first input terminal 21, and a second electrode of the third transistor 103 is electrically connected to the output terminal 27. A first electrode of the fourth transistor 104 is electrically connected to the third power supply line 33, and a second electrode of the fourth transistor 104 is electrically connected to the output terminal 27. A first electrode of the fifth transistor 105 is electrically connected to the fourth power supply line 34, a second electrode of the fifth transistor 105 is electrically connected to the gate electrode of the second transistor 102 and the gate electrode of the fourth transistor 104, and a gate electrode of the fifth transistor 105 is electrically connected to the fourth input terminal 24. A first electrode of the sixth transistor 106 is electrically connected to the fourth power supply line 34, a second electrode of the sixth transistor 106 is electrically connected to the gate electrode of the second transistor 102 and the gate electrode of the fourth transistor 104, and a gate electrode of the sixth transistor 106 is electrically connected to the fifth input terminal 25. A first electrode of the seventh transistor 107 is electrically connected to the fifth power supply line 35, a second electrode of the seventh transistor 107 is electrically connected to the gate electrode of the second transistor 102 and the gate electrode of the fourth transistor 104, and a gate electrode of the seventh transistor 107 is electrically connected to the sixth input terminal 26. A first electrode of the eighth transistor 108 is electrically connected to the fifth power supply line 35, a second electrode of the eighth transistor 108 is electrically connected to a second electrode of the ninth transistor 109, and a gate electrode of the eighth transistor 108 is electrically connected to the second input terminal 22. A first electrode of the ninth transistor 109 is electrically connected to the gate electrode of the second transistor 102 and the gate electrode of the fourth transistor 104, and a gate electrode of the ninth transistor 109 is electrically connected to the third input terminal 23. A first electrode of the first capacitor 111 is electrically connected to the sixth power supply line 36, and a second electrode of the first capacitor 111 is electrically connected to the gate electrode of the second transistor 102 and the gate electrode of the fourth transistor 104. A first electrode of the second capacitor 112 is electrically connected to the output terminal 27, and the second electrode of the second capacitor 112 is electrically connected to the second electrode of the first transistor 101 and the gate electrode of the third transistor 103.

In FIG. 1C, a connection point of the second electrode of the first transistor 101, the second electrode of the second transistor 102, the gate electrode of the third transistor 103, and the second electrode of the second capacitor 112 is referred to as a node A. In addition, a connection point of the gate electrode of the second transistor 102, the gate electrode of the fourth transistor 104, the second electrode of the fifth transistor 105, the second electrode of the sixth transistor 106, the second electrode of the seventh transistor 107, the first electrode of the ninth transistor 109, and the second electrode of the first capacitor 111 is referred to as a node B. Further, a connection point of the second electrode of the third transistor 103, the second electrode of the fourth transistor 104, the first electrode of the second capacitor 112, and the output terminal 27 is referred to as a node C.

Next, operation of the shift register shown in FIGS. 1A to 1C is described with reference to FIG. 2, FIGS. 3A to 3D, and FIGS. 4A to 4D. Specifically, description is made by dividing a period of a timing chart of FIG. 2 into a first period 51, a second period 52, a third period 53, a fourth period 54, and a fifth period 55. Note that in the following description, the first to ninth transistors 101 to 109 are N-channel thin film transistors, and they are in a conductive state when voltage (Vgs) between the gate and the source exceeds a threshold voltage (Vth).

In addition, here, an output of the second pulse output circuit $10\__2$ is described. The first input terminal 21 of the second pulse output circuit $10\__2$ is electrically connected to the second signal line 12 which supplies the second clock signal (CK2), the second input terminal 22 of the second pulse output circuit $10\__2$ is electrically connected to the third signal line 13 which supplies the third clock signal (CK3), and the third input terminal 23 of the second pulse output circuit $10\__2$ is electrically connected to the fourth signal line 14 which supplies the fourth clock signal (CK4).

Note that a potential (VDD) of V1 is supplied to the first power supply line 31 and the fifth power supply line 35, and a potential (VSS) of V2 is supplied to the second to fourth power supply lines 32 to 34 and the sixth power supply line 36, where V1>V2 is satisfied. In addition, although the first to fourth clock signals (CK1) to (CK4) are signals which alternate between an H level signal and an L level signal at a regular interval, a potential is VDD when the clock signal is at an H level, and a potential is VSS when the clock signal is at an L level. In addition, here, VSS=0 is satisfied for simplification of explanation; however, the present invention is not limited thereto.

In the first period 51, the second start pulse (SP2) becomes an H level, and the first transistor 101 and the fifth transistor 105 which are electrically connected to the fourth input terminal 24 of the second pulse output circuit $10\__2$ are turned on. Since the third clock signal (CK3) and the fourth clock signal (CK4) are at an H level, the eighth transistor 108 and the ninth transistor 109 are also turned on (see FIG. 3A).

At this time, since the first transistor 101 is turned on, a potential of the node A increases. In addition, although a direct tunneling current flows between the fifth power supply line 35 and the fourth power supply line 34, a potential of the node B is controlled so that the second transistor 102 is turned off by adjusting the size of the transistor. For example, an off state of the second transistor 102 is realized in such a way that a channel width (a channel width in a direction perpendicular to a direction along which a carrier flows in a source region and a drain region) of the fifth transistor 105 is longer than that of the eighth transistor 108 or the ninth transistor 109.

In the second period 52, an H level signal is outputted from the output terminal 27 (OUT (1)) of the first pulse output circuit $10\_1$, and the sixth transistor 106 which is electrically connected to the fifth input terminal 25 of the second pulse output circuit $10\_2$ is turned on. In addition, the third clock signal (CK3) becomes an L level, and the eighth transistor 108 is turned off; therefore, a direct tunneling current which is seen in the first period 51 vanishes (see FIG. 3B).

At this time, the second electrode of the first transistor 101 functions as a source electrode, and the potential of the node A is a value in which a threshold voltage of the first transistor 101 is extracted from a potential of the first power supply line 31; therefore, V1−Vth101 (Vth101 is the threshold voltage of the first transistor 101) is obtained. Accordingly, the first transistor 101 is turned off, and the node A is in a floating state while holding V1−Vth101.

Here, a potential of the gate electrode of the third transistor 103 becomes V1−Vth101. When a voltage between the gate and the source of the third transistor 103 exceeds the threshold value thereof, that is, (V1−Vth101−V2)>Vth103 (Vth103 is a threshold voltage of the third transistor 103) is satisfied, the third transistor 103 is turned on.

In the third period 53, the second start pulse (SP2) becomes an L level, and the first transistor 101 and the fifth transistor 105 are turned off. In addition, the second clock signal (CK2) becomes an H level, and an H level signal is supplied to the first electrode of the third transistor 103 which is electrically connected to the first input terminal 21 (see FIG. 3C).

Here, since the third transistor 103 is turned on, current is generated between the source and the drain, a potential of the node C (the output terminal 27 (OUT(2)), namely, a potential of the second electrode (in this case, the source electrode) of the third transistor 103 begins to increase. There is capacitive coupling due to the second capacitor 112 between the gate and the source of the third transistor 103, and with the increase in the potential of the node C, a potential of the gate electrode of the third transistor 103 which is in a floating state increases (bootstrap operation). Ultimately, the potential of the gate electrode of the third transistor 103 is higher than V1+Vth103, and the potential of the node C is equal to V1.

Note that this bootstrap operation is performed by providing the second capacitor 112 between the gate electrode and the second electrode of the third transistor 103; however, the bootstrap operation may be performed with capacitive coupling of channel capacitance of the third transistor 103 and capacitive coupling of parasitic capacitance between the gate electrode and the second electrode of the third transistor 103, without providing the second capacitor 112.

At this time, since the output terminal 27 (OUT (1)) of the first pulse output circuit $10\_1$ is at an H level, the sixth transistor 106 is turned on, and the node B is held at an L level. Accordingly, when the potential of the node C rises from an L level to an H level, malfunction due to capacitive coupling of the node B and the node C can be suppressed.

Then, in the latter half of the third period 53, the output terminal 27 (OUT (1)) of the first pulse output circuit $10\_1$ becomes an L level, and the sixth transistor 106 is turned off, whereby the node B is placed in a floating state. In addition, the third clock signal (CK3) becomes an H level, and the eighth transistor 108 is turned on (see FIG. 3D).

In the fourth period 54, the output terminal 27 (OUT (4)) of the fourth pulse output circuit $10\_4$ becomes an H level, and the input terminal 26 of the second pulse output circuit $10\_2$ which is electrically connected to the output terminal 27 of the fourth pulse output circuit $10\_4$ becomes an H level, whereby the seventh transistor 107 is turned on, and the node B also becomes an H level. Accordingly, the second transistor 102 and the fourth transistor 104 are turned on and the third transistor 103 is turned off, so that the output terminal 27 (OUT (2)) becomes an L level. In addition, the fourth clock signal (CK4) becomes an H level, and the ninth transistor 109 is turned on (see FIG. 4A).

Figure 4A:
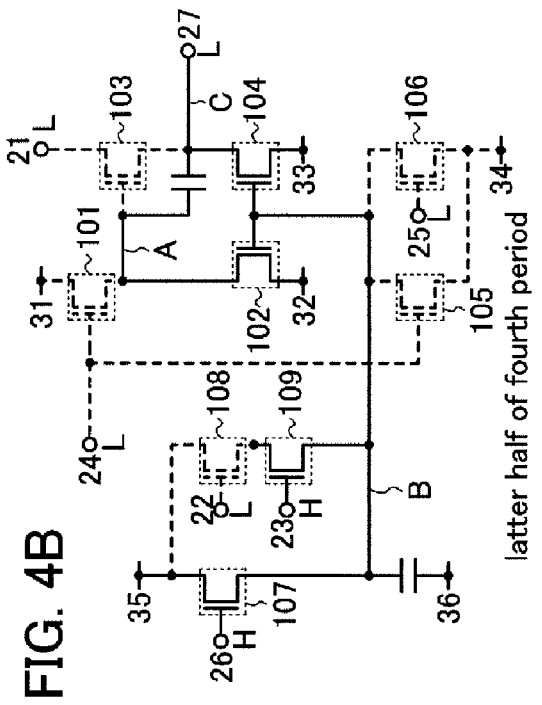
FIGS. 4A to 4D are diagrams each showing an operation example of a pulse output circuit of the present invention.
Figure 4B:
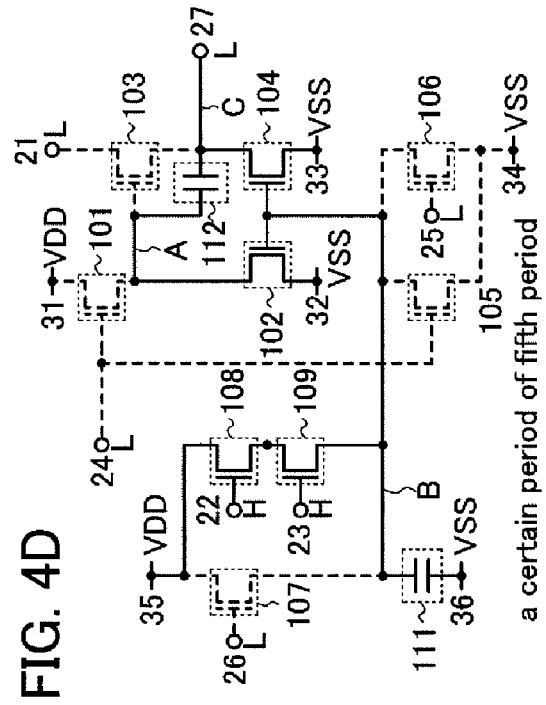
Figure 4C:
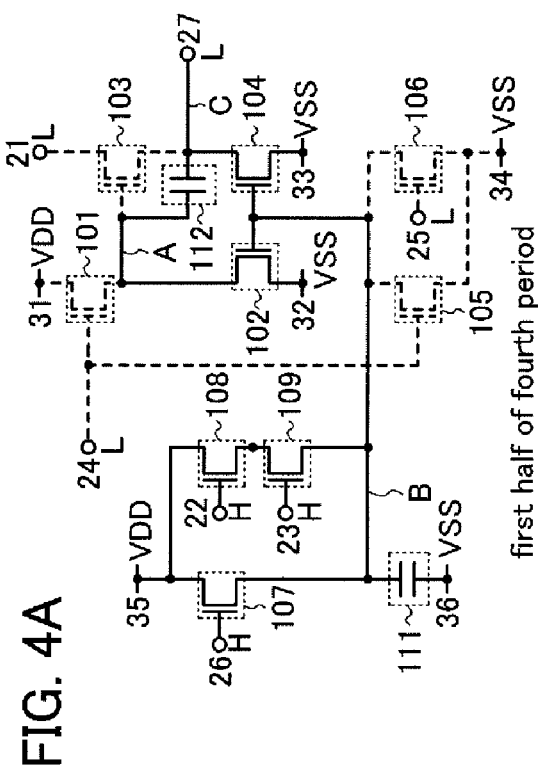

Then, in the latter half of the fourth period 54, the third clock signal (CK3) becomes an L level, and the eighth transistor 108 is turned off (see FIG. 4B).

In the fifth period 55, the output terminal 27 (OUT (4)) of the fourth pulse output circuit $10\_4$ becomes an L level, the seventh transistor 107 is turned off, and the node B is in a floating state while holding an H level. Accordingly, the second transistor 102 and the fourth transistor 104 continue to be an on state (see FIG. 4C).

Figure 4D:
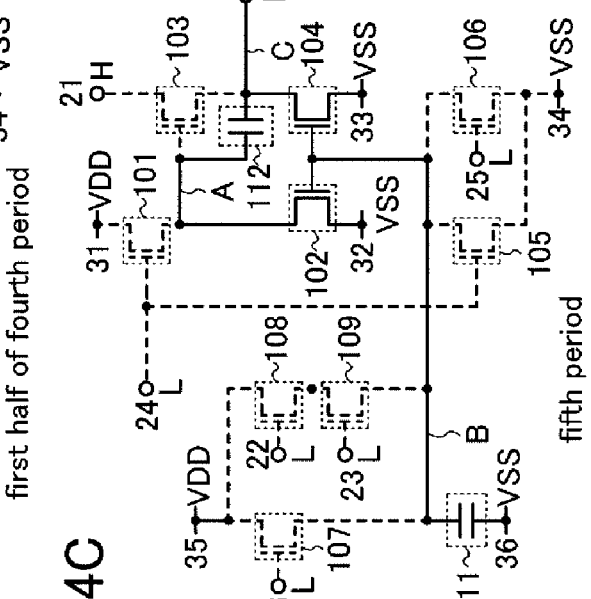

Then, in a certain period (when both the third clock signal (CK3) and the fourth clock signal (CK4) are at an H level) of the fifth period 55, the eighth transistor 108 and the ninth transistor 109 are turned on, and an H level signal is regularly supplied to the node B (see FIG. 4D).

In this way, in a period during which the potential of the output terminal 27 is held at an L level, an H level signal is regularly supplied to the node B; therefore, malfunction of a pulse output circuit can be suppressed. In addition, by regularly turning on or off the eighth transistor 108 and the ninth transistor 109, a shift of a threshold value of the transistor can be decreased.

In addition, in the fifth period 55, while an H level signal is not supplied from the fifth power supply line 35 to the node B, the potential of the node B may be decreased due to the off-current of the fifth transistor 105 and the sixth transistor 106 in some cases. However, since the first capacitor 111 is electrically connected to the node B, decrease in the potential of the node B can be mitigated.

Note that, in this embodiment mode, the case where the fifth power supply line 35 is set at the same potential (VDD) of V1 as the first power supply line 31 is shown; however, the fifth power supply line 35 may be set lower than the first power supply line 31 (V1>V35>V2 is satisfied, and V35 is a potential of the fifth power supply line 35). As a result of this, the potential of the gate electrode of the second transistor 102 and the potential of the gate electrode of the fourth transistor 104 can be suppressed, the shift of the threshold value of the second transistor 102 and the shift of the threshold value of the fourth transistor 104 are reduced, whereby deterioration can be suppressed.

Figure 5A:
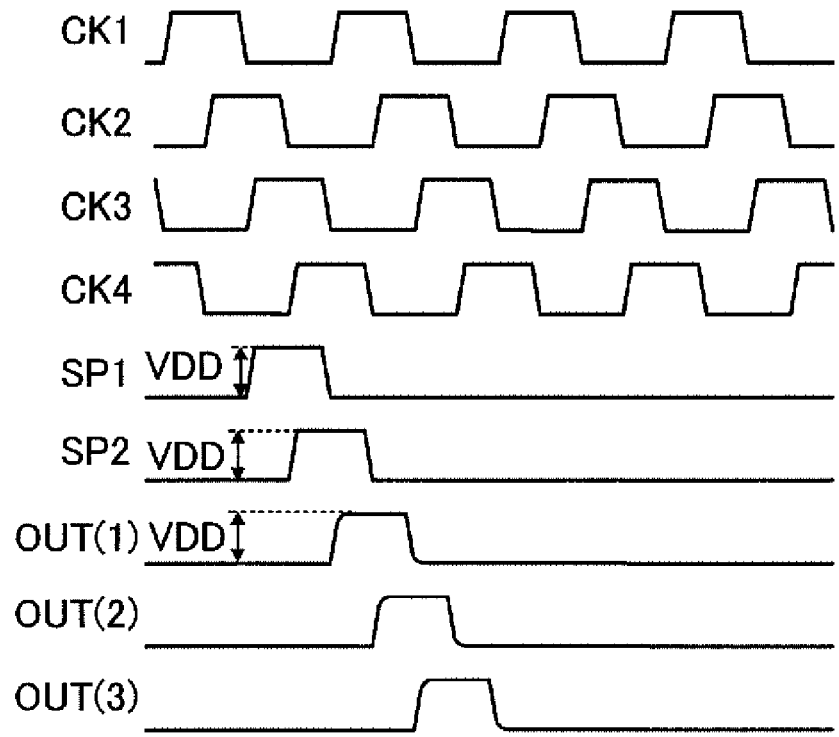
FIG. 5A is a diagram showing operation of a pulse output circuit of the present invention.
Figure 5B:
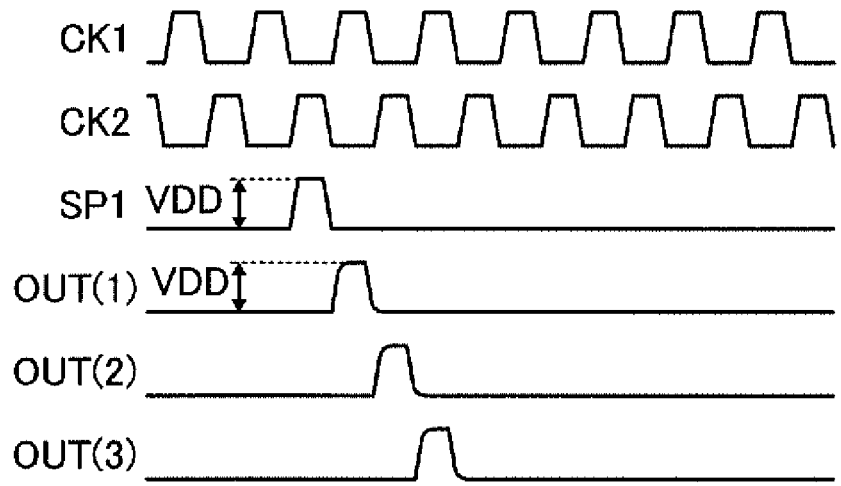
FIG. 5B is a diagram showing operation of a conventional pulse output circuit, which are compared with each other.

In addition, the shift register described in this embodiment mode uses a driving method in which a pulse outputted from the m-th pulse output circuit overlaps half (½ period) of a pulse outputted from the (m+1)th pulse output circuit, as shown in FIG. 5A. This can make time to charge in a wiring about twice as long as that in a driving method in which a pulse outputted from the m-th pulse output circuit does not overlap a pulse outputted from the (m+1)th pulse output circuit in a conventional shift register (see FIG. 5B). In this way, by using a driving method in which a pulse outputted from the m-th pulse output circuit overlaps half (½ period) of a pulse outputted from the (m+1)th pulse output circuit, the present invention can provide a pulse output circuit which can withstand large load and operate at high frequency. In addition, an operating condition of a pulse output circuit can be improved. In particular, it is very effective to use the driving method shown in FIG. 5A for a thin film transistor using amorphous silicon of which electric characteristics are inferior.

Note that the shift register and the pulse output circuit shown in this embodiment mode can be combined with any structure of a shift register and a pulse output circuit shown in other embodiment modes in this specification. Also, the present invention in this embodiment mode can be also applied to a semiconductor device. A semiconductor device in this specification means a device that can function by utilizing the semiconductor characteristics.

Embodiment Mode 2

In this embodiment mode, structures of a shift register and a pulse output circuit which are different from those in the above embodiment mode will be described with reference to drawings.

Figure 6A:
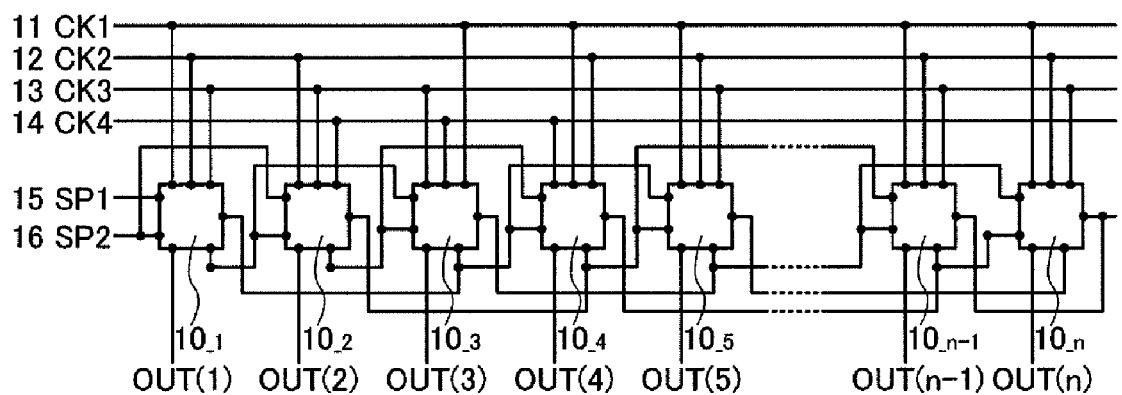
FIG. 6A is a diagram showing an example of a shift register of the present invention.
Figure 6B:
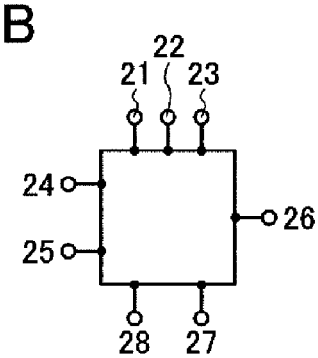
FIGS. 6B and 6C are diagrams each showing an example of a pulse output circuit of the present invention.

A shift register shown in this embodiment mode includes the first to n-th pulse output circuits $10\_{_1}$ to $10\_{_n}$ ($n \geq 3$) and the first to fourth signal lines 11 to 14 each of which outputs a clock signal (see FIG. 6A). In addition, each of the first to n-th pulse output circuits $10\_{_1}$ to $10\_{_n}$ includes the first input terminal 21, the second input terminal 22, the third input terminal 23, the fourth input terminal 24, the fifth input terminal 25, the sixth input terminal 26, the first output terminal 27, and a second output terminal 28 (see FIG. 6B). Note that the shift register in this embodiment mode has a structure in which the second output terminal 28 is added to the pulse output circuit described in Embodiment Mode 1.

The first input terminal 21, the second input terminal 22, and the third input terminal 23 are electrically connected to any of the first to fourth signal lines 11 to 14. In the m-th pulse output circuit ($m \geq 3$) of the shift register shown in this embodiment mode, the fourth input terminal 24 of the m-th pulse output circuit is electrically connected to the first output terminal 27 of the (m−2)th pulse output circuit and the fifth input terminal 25 of the (m−1)th pulse output circuit. The fifth input terminal 25 of the m-th pulse output circuit is electrically connected to the first output terminal 27 of the (m−1)th pulse output circuit and the fourth input terminal 24 of the (m+1)th pulse output circuit. The sixth input terminal 26 of the m-th pulse output circuit is electrically connected to the first output terminal 27 of the (m+2)th pulse output circuit. The first output terminal 27 of the m-th pulse output circuit is electrically connected to the sixth input terminal 26 of the (m−2)th pulse output circuit, the fifth input terminal 25 of the (m+1)th pulse output circuit, and the fourth input terminal 24 of the (m+2)th pulse output circuit, and the second output terminal 28 of the m-th pulse output circuit outputs a signal to OUT(m).

That is, the shift register shown in this embodiment mode is provided with the first output terminal 27 and the second output terminal 28 and has a structure in which an output terminal for outputting a signal to another pulse output circuit and another output terminal for outputting a signal to outside are provided.

Next, a specific structure of each of the first to n-th pulse output circuits $10\_{_1}$ to $10\_{_n}$ shown in this embodiment mode will be described.

Figure 6C:
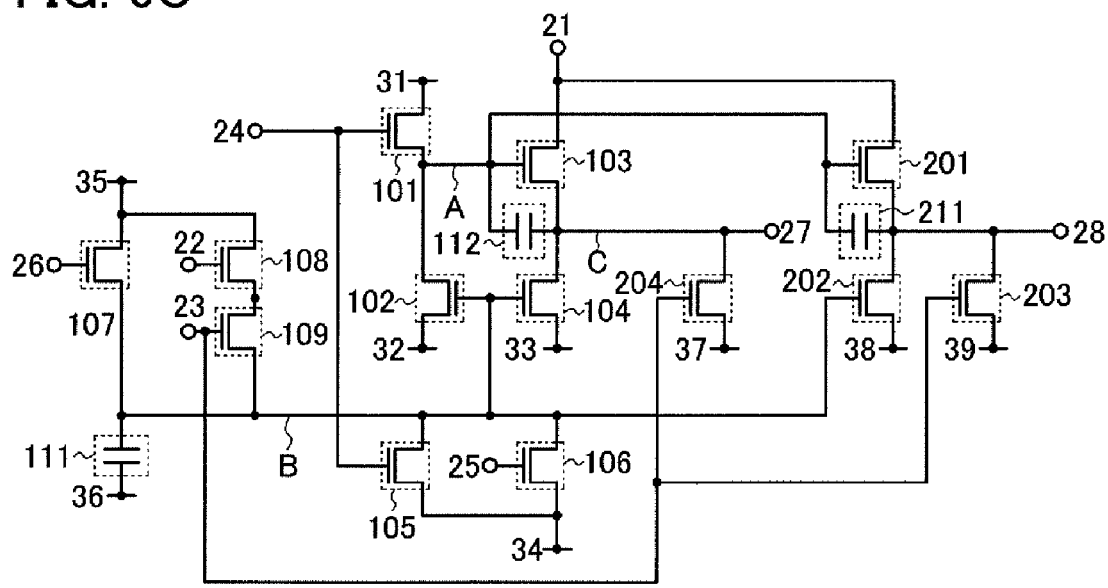
Figure 7A:
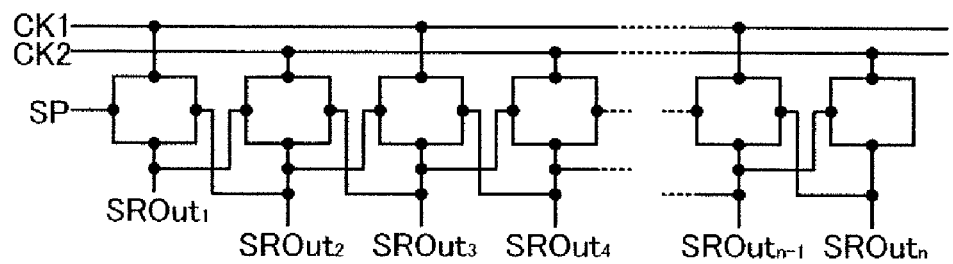
FIG. 7A is a diagram showing an example of a conventional shift register.
Figure 7B:
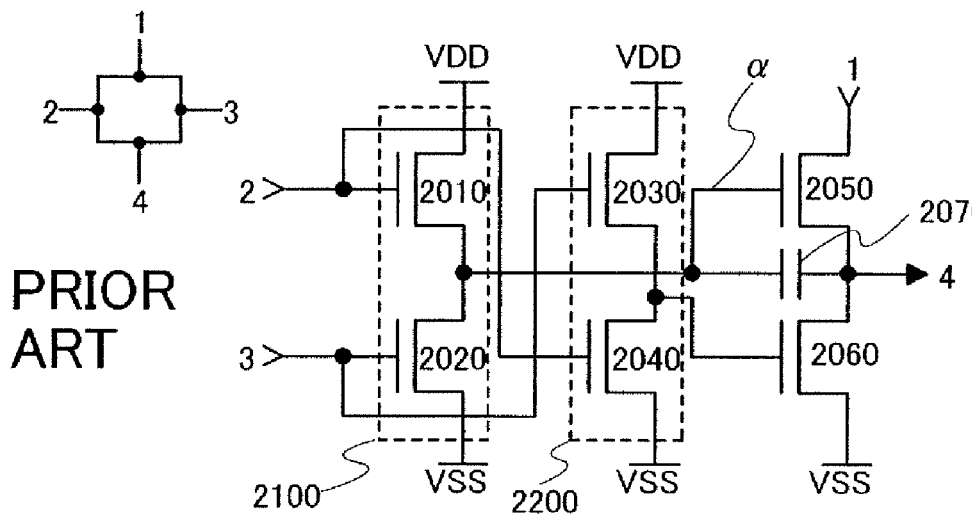
FIG. 7B is a diagram showing an example of a conventional pulse output circuit.
Figure 7C:
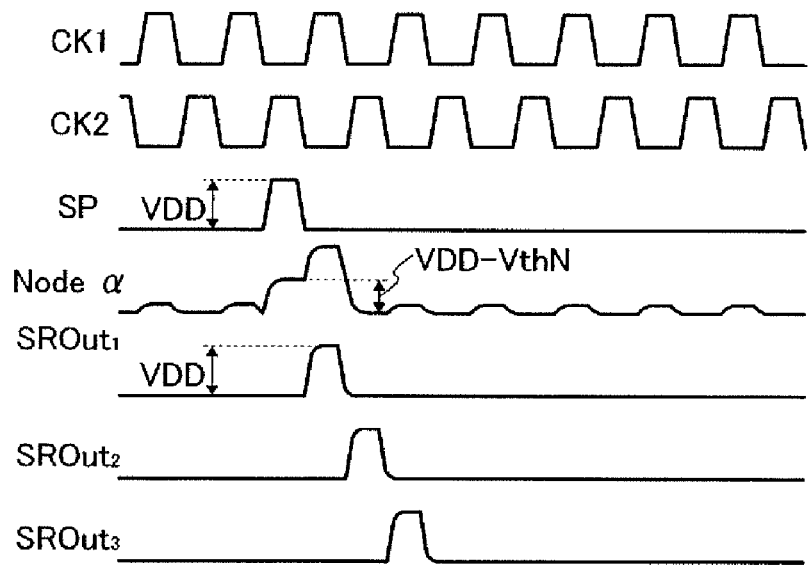
FIG. 7C is a diagram showing an example of operation of the conventional pulse output circuit.
Figure 8A:
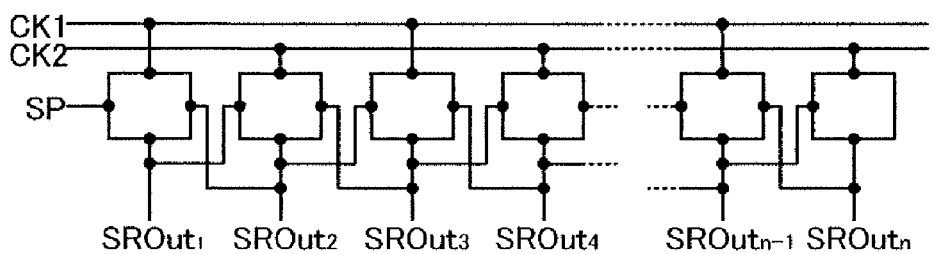
FIG. 8A is a diagram showing an example of a conventional shift register.
Figure 8B:
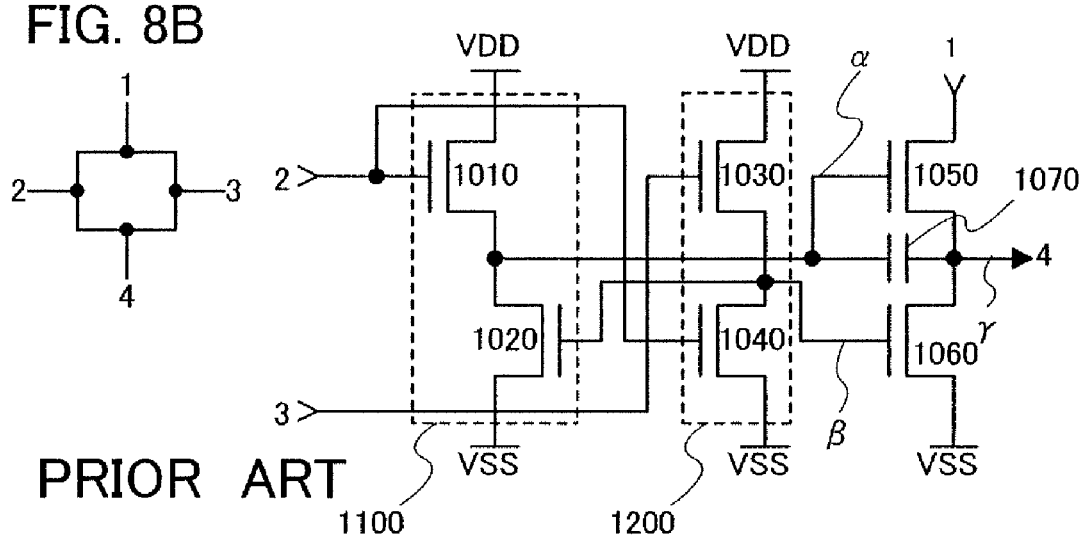
FIG. 8B is a diagram showing an example of a conventional pulse output circuit.
Figure 8C:
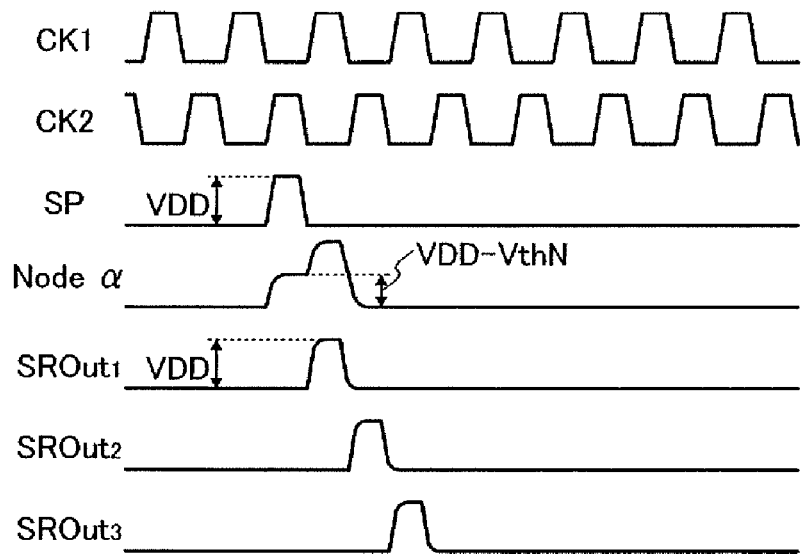
FIG. 8C is a diagram showing an example of operation of the conventional pulse output circuit.

Each of the first to n-th pulse output circuits $10\_{_1}$ to $10\_{_n}$ includes the first to ninth transistors 101 to 109, tenth to thirteenth transistors 201 to 204, the first capacitor 111, the second capacitor 112, and a third capacitor 211 (see FIG. 6C). The pulse output circuit shown in this embodiment mode has a structure in which the tenth to thirteenth transistors 201 to 204 and the third capacitor 211 are added to the pulse output circuit described in Embodiment Mode 1. Further, signals are supplied to the transistors from the second output terminal 28 and seventh to ninth power supply lines 37 to 39, in addition to the first to sixth input terminals 21 to 26, the first output terminal 27, and the first to sixth power supply lines 31 to 36 which are described in Embodiment Mode 1.

A first electrode of the tenth transistor 201 is electrically connected to the first input terminal 21, a second electrode of the tenth transistor 201 is electrically connected to the second output terminal 28, and a gate electrode of the tenth transistor 201 is electrically connected to the second electrode of the first transistor 101. A first electrode of the eleventh transistor 202 is electrically connected to the eighth power supply line 38, a second electrode of the eleventh transistor 202 is electrically connected to the second output terminal 28, and the gate electrode of the eleventh transistor 202 is electrically connected to the gate electrode of the second transistor 102 and the gate electrode of the fourth transistor 104. A first electrode of the twelfth transistor 203 is electrically connected to the ninth power supply line 39, a second electrode of the twelfth transistor 203 is electrically connected to the second output terminal 28, and a gate electrode of the twelfth transistor 203 is electrically connected to a gate electrode of the ninth transistor 109. A first electrode of the thirteenth transistor 204 is electrically connected to the seventh power supply line 37, a second electrode of the thirteenth transistor 204 is electrically connected to the first output terminal 27, and a gate electrode of the thirteenth transistor 204 is electrically connected to the gate electrode of the ninth transistor 109. A first electrode of the third capacitor 211 is electrically connected to the second output terminal 28, and a second electrode of the third capacitor 211 is electrically connected to the second electrode of the first transistor 101 and the gate electrode of the tenth transistor 201.

In addition, a potential (VSS) of V2 can be supplied to the seventh to ninth power supply lines 37 to 39, similarly to the second to fourth power supply lines 32 to 34 and the sixth power supply line 36.

The first output terminal 27 and the second output terminal 28 are provided so that the same signal is outputted, the tenth transistor 201 corresponds to the third transistor 103, and the eleventh transistor 202 corresponds to the fourth transistor 104. That is, the tenth transistor 201 performs bootstrap operation similarly to the third transistor 103. Note that the bootstrap operation of the tenth transistor 201 is performed by providing the third capacitor 211 between the gate electrode and the second electrode of the tenth transistor 201; however, the bootstrap operation may be performed with capacitive coupling of channel capacitance of the tenth transistor 201 and capacitive coupling of parasitic capacitance between the gate electrode and the second electrode of the tenth transistor 201, without providing the third capacitor 211.

The twelfth transistor 203 and the thirteenth transistor 204 are used so as to shorten fall time of a potential of a scan line. When the twelfth transistor 203 and the thirteenth transistor 204 can sufficiently shorten the fall time of the potential of the scan line, the fourth transistor 104 and the eleventh transistor 202 do not necessarily shorten the fall time of the potential of the scan line. Therefore, the potential of the fifth power supply line 35 can be set lower than a power source of the first power supply line 31, which can reduce threshold shifts of the fourth transistor 104, the eleventh transistor 202, and the second transistor 102.

Note that the shift register and the pulse output circuit shown in this embodiment mode can be combined with any structure of a shift register and a pulse output circuit shown in other embodiment modes in this specification. Also, the present invention in this embodiment mode can be also applied to a semiconductor device.

Embodiment Mode 3

In this embodiment mode, structures of a shift register and a pulse output circuit which are different from those in the above embodiment modes will be described.

In the structures described in Embodiment Modes 1 and 2, the examples in which all of the circuits are formed using N-channel thin film transistors are shown; however, a similar structure may be used in which only P-channel thin film transistors are used in terms of using unipolar thin film transistors. Although not shown in particular, in FIG. 1C or FIG. 6C, connection of the transistors is the same, and high and low level potentials of a power source line may be inverted to the cases described in Embodiment Modes 1 and 2. In addition, a structure may be used in which H level signals to be inputted and L level signals to be inputted are all inverted and inputted. Note that the present invention in this embodiment mode can be also applied to a semiconductor device.

Embodiment Mode 4

A structure in which a display device is provided with the shift register described in the above embodiment modes will be described with reference to drawings.

Figure 9A:
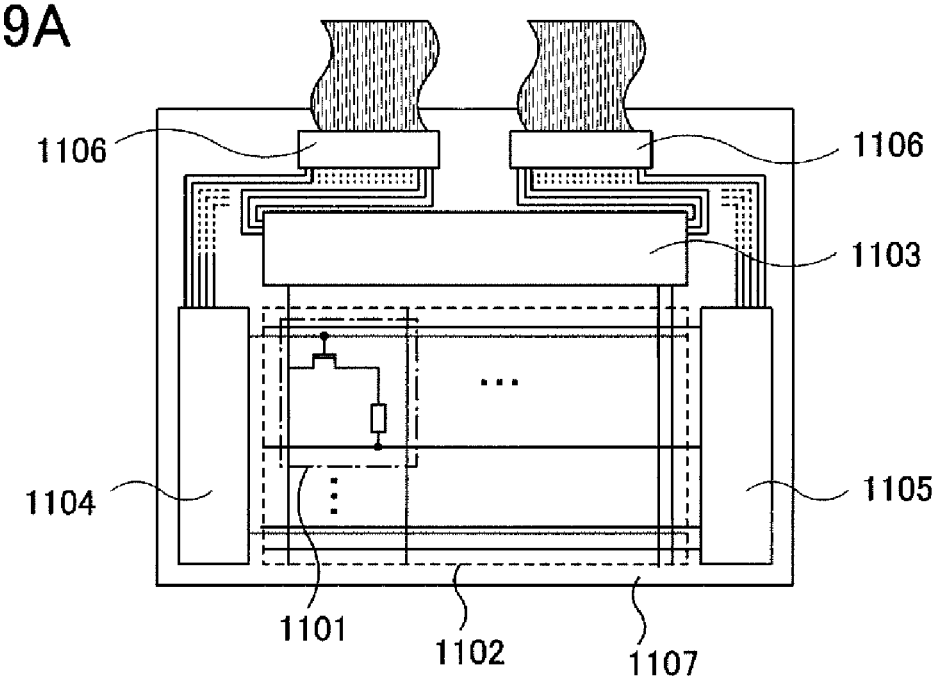
FIGS. 9A to 9C are diagrams each showing an example of a display device provided with a shift register of the present invention.

In FIG. 9A, a display device includes a pixel portion 1102 in which a plurality of pixels 1101 is arranged in matrix over a substrate 1107, and includes a signal line driver circuit 1103, a first scan line driver circuit 1104, and a second scan line driver circuit 1105 at the periphery of the pixel portion 1102. Signals are supplied from outside to these driver circuits through an FPC 1106.

Figure 9B:
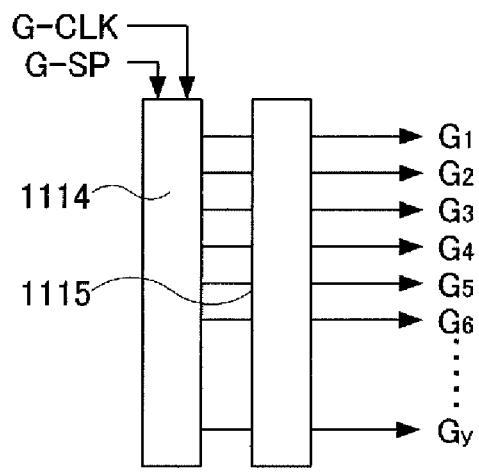

In FIG. 9B, the structure of the first scan line driver circuit 1104 and the second scan line driver circuit 1105 is shown. Each of the scan line driver circuits 1104 and 1105 includes a shift register 1114 and a buffer 1115. In addition, in FIG. 9C, a structure of the signal line driver circuit 1103 is shown. The signal line driver circuit 1103 includes a shift register 1111, a first latch circuit 1112, a second latch circuit 1113, and a buffer 1117.

A circuit which operates as the shift register described in this embodiment mode can be applied to the circuit of the shift register 1111 and the circuit of the shift register 1114. By using the circuit which operates as the shift register described in the above embodiment modes, the circuit which operates as the shift register can be operated at high frequency even when the circuit which operates as the shift register is provided by using a thin film transistor which uses amorphous silicon.

Figure 9C:
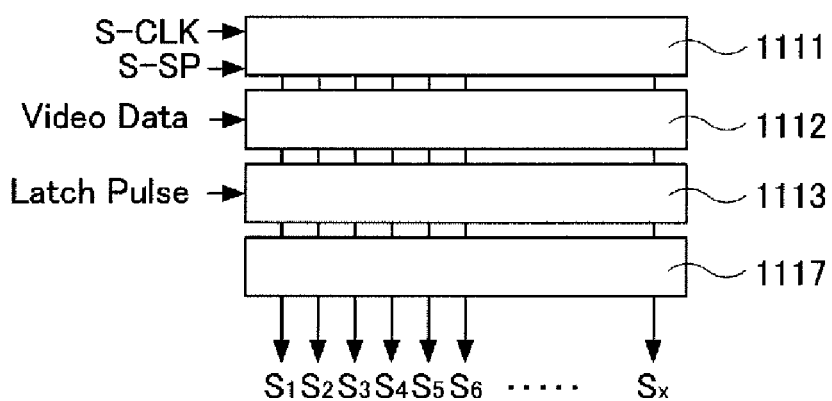

Note that the structures of the scan line driver circuit and the signal line driver circuit are not limited to the structures shown in FIGS. 9A to 9C, and for example, a sampling circuit, a level shifter, or the like may be provided. Besides the above driver circuits, a circuit such as a CPU or a controller may be formed on the substrate 1107, which is particularly advantageous to a portable terminal and the like because the number of external circuits (IC) to be connected decreases and further reduction in weight and thickness can be achieved.

Note that the display device shown in this embodiment mode can be combined with any structure of a shift register, a pulse output circuit, or a display device shown in other embodiment modes in this specification.

Embodiment Mode 5

In this embodiment mode, a structure of a display panel used for the display device described in Embodiment Mode 4 will be described with reference to drawings.

Figure 10A:
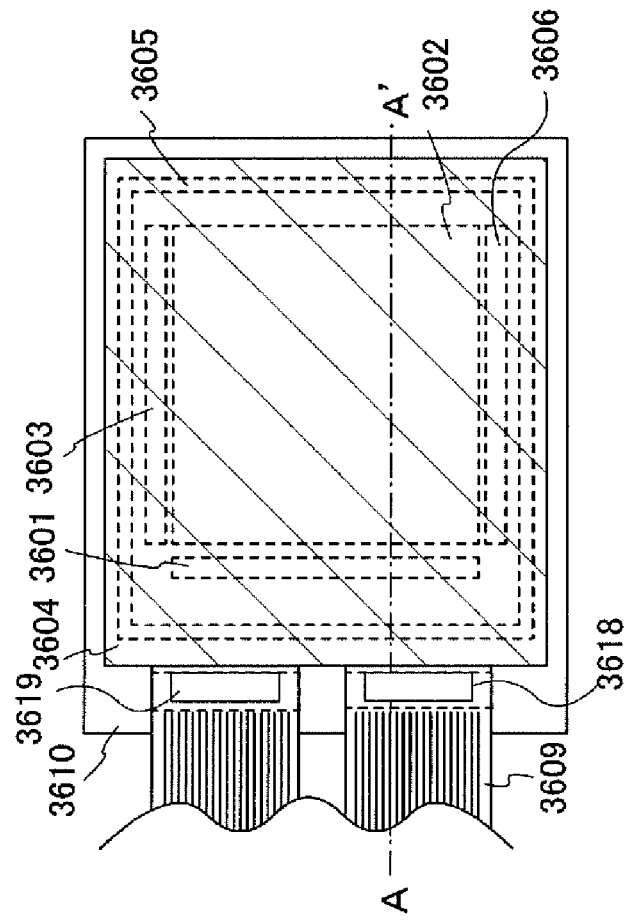
FIGS. 10A and 10B are diagrams each showing an example of a display device provided with a shift register of the present invention.
Figure 10B:
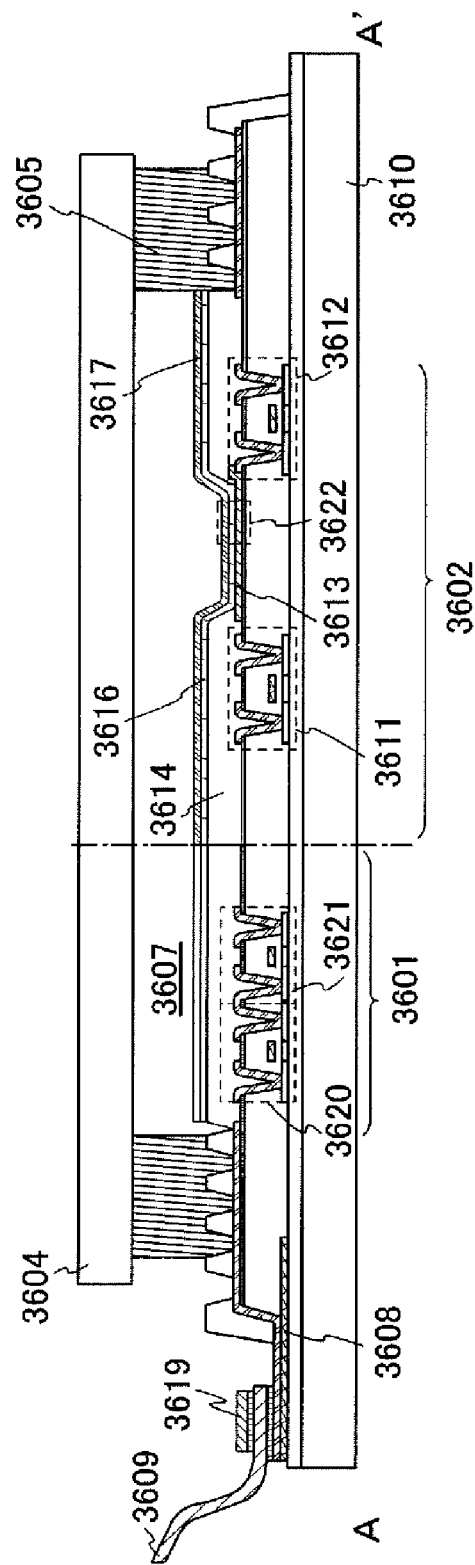

First, a display panel applicable to the display device is described with reference to FIGS. 10A and 10B. Note that FIG. 10A is a top view showing a display panel, and FIG. 10B is a cross-sectional view of FIG. 10A taken along line A-A'. The display panel includes a signal line driver circuit 3601, a pixel portion 3602, a second scan line driver circuit 3603, and a first scan line driver circuit 3606 which are indicated by dotted lines. It also includes a sealing substrate 3604 and a sealant 3605, and a portion surrounded by the sealant 3605 is a space 3607.

Note that a wiring 3608 is a wiring for transmitting a signal to be inputted to the second scan line driver circuit 3603, the first scan line driver circuit 3606, and the signal line driver circuit 3601 and receives a video signal, a clock signal, a start signal, and the like through an FPC (Flexible Printed Circuit) 3609 that serves as an external input terminal. An IC chip (a semiconductor chip provided with a memory circuit, a buffer circuit, or the like) 3618 and an IC chip 3619 are mounted by COG (Chip On Glass) or the like at the junction of the FPC 3609 and the display panel. Note that only the FPC is shown here; however, a printed wiring board (PWB) may be attached to the FPC. The display device in this specification includes not only a display panel itself but also a display panel with an FPC or a PWB attached thereto. In addition, it also includes a display panel on which an IC chip or the like is mounted.

Next, a cross-sectional structure is described with reference to FIG. 10B. The pixel portion 3602 and its peripheral driver circuits (the second scan line driver circuit 3603, the first scan line driver circuit 3606, and the signal line driver circuit 3601) are formed over a substrate 3610; here, the signal line driver circuit 3601 and the pixel portion 3602 are shown.

Note that as the signal line driver circuit 3601, a CMOS circuit is formed using an N-channel TFT 3620 and a P-channel TFT 3621. In this embodiment mode, the display panel in which the peripheral driver circuits are formed over the same substrate is described; however, the present invention is not limited to this. All or part of the peripheral driver circuits may be formed on an IC chip or the like and mounted by COG or the like.

The pixel portion 3602 includes a plurality of circuits each forming a pixel which includes a switching TFT 3611 and a driving TFT 3612. Note that a source electrode of the driving TFT 3612 is electrically connected to a first electrode 3613. An insulator 3614 is formed to cover end portions of the first electrode 3613. Here, a positive type photosensitive acrylic resin film is used.

The insulator 3614 is formed to have a curved surface with a curvature at an upper end portion or a lower end portion thereof in order to make the coverage favorable. For example, in the case of using positive type photosensitive acrylic as a material of the insulator 3614, the insulator 3614 is preferably formed to have a curved surface with a curvature radius (0.2 µm to 3 µm) only at the upper end portion. Either a negative type which becomes insoluble in an etchant by light irradiation or a positive type which becomes soluble in an etchant by light irradiation can be used as the insulator 3614.

A layer 3616 containing an organic compound and a second electrode 3617 are formed over the first electrode 3613.

Here, a material having a high work function is preferably used as a material used for the first electrode 3613 which functions as an anode. For example, the first electrode 3613 can be formed using a single-layer film such as an ITO (Indium Tin Oxide) film, an indium zinc oxide (IZO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and a titanium nitride film; or the like. When the first electrode 3613 has a stacked structure, it can have low resistance as a wiring and form a favorable ohmic contact. Further, the first electrode can function as an anode.

In addition, the layer 3616 containing an organic compound is formed by an evaporation method using an evaporation mask or an ink-jet method. A metal complex belonging to Group 4 of the Periodic Table is used for part of the layer 3616 containing an organic compound, and besides, a material which can be used in combination may be either a low molecular material or a high molecular material. In addition, as a material used for the layer containing an organic compound, a single layer or a stacked layer of an organic compound is often used generally. In addition, this embodiment mode also includes a structure in which an inorganic compound is used for part of the film formed of an organic compound. Moreover, a known triplet material can also be used.

As a material used for the second electrode (cathode) 3617 which is formed over the layer 3616 containing an organic compound, a material having a low work function (Al, Ag, Li, Ca, or an alloy thereof such as MgAg, MgIn, AlLi, $CaF_2$, or calcium nitride) may be used. In the case where light generated in the layer 3616 containing an organic compound is transmitted through the second electrode 3617, a stacked layer of a metal thin film with a thin thickness and a transparent conductive film (ITO (Indium Tin Oxide)), an alloy of indium oxide and zinc oxide ($In_2O_3$—ZnO), zinc oxide (ZnO), or the like) is preferably used as the second electrode (cathode) 3617.

By attaching the sealing substrate 3604 to the substrate 3610 with the sealant 3605, a structure is obtained in which a display element 3622 is provided in the space 3607 surrounded by the substrate 3610, the sealing substrate 3604, and the sealant 3605. Note that there is also a case where the space 3607 is filled with the sealant 3605 as well as an inert gas (such as nitrogen or argon).

Note that an epoxy-based resin is preferably used as the sealant 3605. The material preferably allows as little moisture and oxygen as possible to penetrate. As the sealing substrate 3604, a plastic substrate formed of FRP (Fiberglass-Reinforced Plastics), PVF (polyvinyl fluoride), polyester, acrylic, or the like can be used besides a glass substrate or a quartz substrate.

The display panel can be obtained as described above.

As shown in FIGS. 10A and 10B, the signal line driver circuit 3601, the pixel portion 3602, the second scan line driver circuit 3603, and the first scan line driver circuit 3606 are formed over the same substrate, and thereby, reduction in cost of the display device can be realized.

Figure 11A:
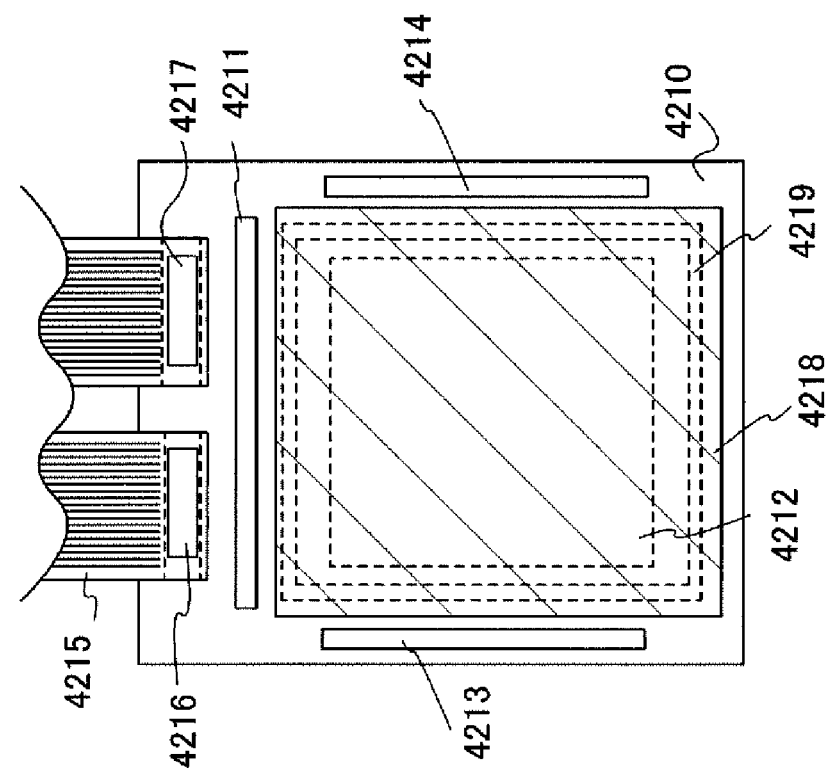
FIGS. 11A and 11B are diagrams each showing an example of a display device provided with a shift register of the present invention.

Note that the structure of the display panel is not limited to the structure shown in FIG. 10A, in which the signal line driver circuit 3601, the pixel portion 3602, the second scan line driver circuit 3603, and the first scan line driver circuit 3606 are formed over the same substrate, and a signal line driver circuit 4201 shown in FIG. 11A, which corresponds to the signal line driver circuit 3601 may be formed over an IC chip and mounted on the display panel by COG or the like.

Note that a substrate 4200, a pixel portion 4202, a second scan line driver circuit 4203, a first scan line driver circuit 4204, an FPC 4205, an IC chip 4206, an IC chip 4207, a sealing substrate 4208, and a sealant 4209 of FIG. 11A correspond to the substrate 3610, the pixel portion 3602, the second scan line driver circuit 3603, the first scan line driver circuit 3606, the FPC 3609, the IC chip 3618, the IC chip 3619, the sealing substrate 3604, and the sealant 3605 of FIG. 10A, respectively.

That is, only the signal line driver circuit of which high speed operation is required among the driver circuits is formed into an IC chip by using a CMOS or the like, and thereby, lower power consumption is realized. Further, when a semiconductor chip formed of a silicon wafer or the like is used as the IC chip, higher speed operation and lower power consumption can be achieved.

Cost reduction can be realized by forming the first scan line driver circuit 4203 and the second scan line driver circuit 4204 each provided with the shift register described in the above embodiment modes, and the pixel portion 4202 over the same substrate.

As described above, cost reduction of a high-definition display device can be realized. Further, by mounting an IC chip including a functional circuit (memory or buffer) at a connection portion of the FPC 4205 and the substrate 4200, a substrate area can be effectively used.

Figure 11B:
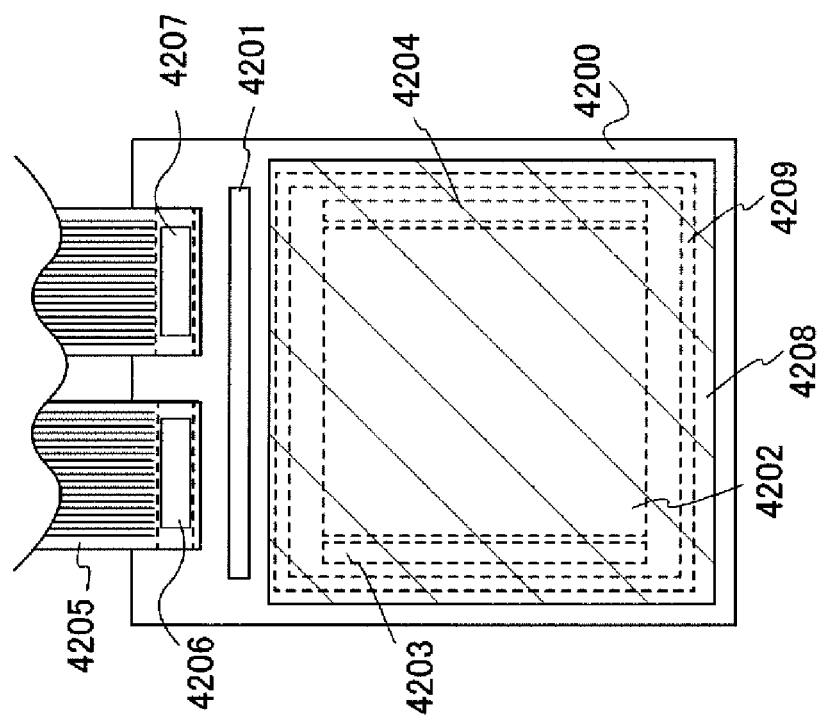

Further, a signal line driver circuit 4211, a second scan line driver circuit 4214, and a first scan line driver circuit 4213 in FIG. 11B which correspond to the signal line driver circuit 3601, the second scan line driver circuit 3603, and the first scan line driver circuit 3606 in FIG. 10A may be formed over an IC chip and mounted on a display panel by COG or the like. In this case, further reduction in power consumption of a high-definition display device can be realized. Accordingly, in order to obtain a display device with less power consumption, polysilicon is preferably used for semiconductor layers of transistors used in the pixel portion. Note that a substrate 4210, a pixel portion 4212, an FPC 4215, an IC chip 4216, an IC chip 4217, a sealing substrate 4218, a sealant 4219 of FIG. 11B correspond to the substrate 3610, the pixel portion 3602, the FPC 3609, the IC chip 3618, the IC chip 3619, the sealing substrate 3604, and the sealant 3605 of FIG. 10A, respectively.

In addition, when amorphous silicon is used for semiconductor layers of transistors in the pixel portion 4212, cost reduction can be realized. Moreover, a large display panel can be manufactured as well.

Figure 15A:
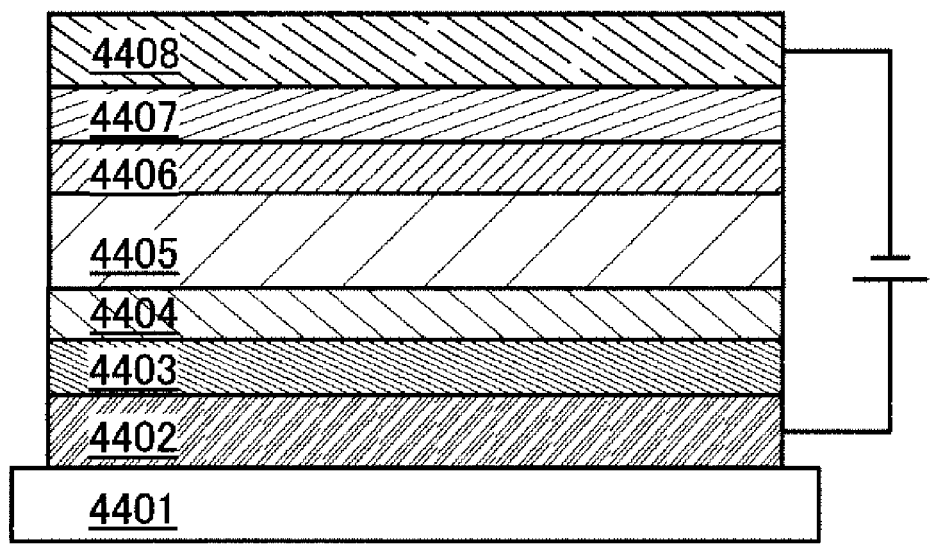
FIGS. 15A and 15B are diagrams each showing an example of a display element of a display device provided with a shift register of the present invention.
Figure 15B:
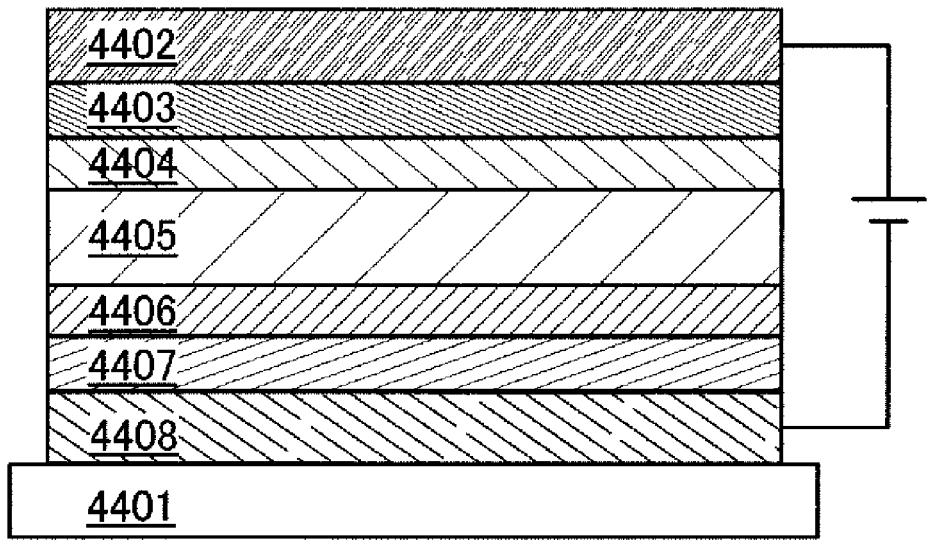

Furthermore, an example of a display element applicable to the display element 3622 is shown in FIGS. 15A and 15B. That is, a structure of the display element applicable to the pixel described in the above embodiment mode is described with reference to FIGS. 15A and 15B.

The display element of FIG. 15A has an element structure in which an anode 4402, a hole injecting layer 4403 formed of a hole injecting material, a hole transporting layer 4404 formed of a hole transporting material, a light emitting layer 4405, an electron transporting layer 4406 formed of an electron transporting material, an electron injecting layer 4407 formed of an electron injecting material, and a cathode 4408 are stacked over a substrate 4401. Here, the light emitting layer 4405 may be formed of only one kind of a light emitting material; however, it may be formed of two or more kinds of materials. In addition, an element structure of the present invention is not limited to this structure.

In addition to the stacked structure of respective functional layers shown in FIGS. 15A and 15B, there is a wide range of variation in element structure, such as an element using a high molecular compound or a high-efficiency element in which a light emitting layer is formed using a triplet light emitting material that emits light from a triplet excited state. In addition, the element structure of the present invention is also applicable to a white display element realized by controlling a carrier recombination region with a hole blocking layer to divide a light emitting region into two regions, or the like.

In a manufacturing method of the element of the present invention shown in FIG. 15A, first, a hole injecting material, a hole transporting material, and a light emitting material are evaporated in this order over the substrate 4401 provided with the anode 4402 (ITO). Then, an electron transporting material and an electron injecting material are evaporated, and finally, the cathode 4408 is formed by evaporation.

Next, suitable materials for the hole injecting material, the hole transporting material, the electron transporting material, the electron injecting material, and the light emitting material are listed below.

As the hole injecting material, a porphyrin compound, phthalocyanine (hereinafter referred to as "$H_2Pc$"), copper phthalocyanine (hereinafter referred to as "CuPc"), or the like is effective among organic compounds. In addition, a material which has a smaller value of an ionization potential than that of the hole transporting material to be used and has a hole transporting function can also be used as the hole injecting material. There is also a chemically-doped conductive high molecular compound, which includes polyethylenedioxythiophene (hereinafter referred to as "PEDOT") doped with polystyrene sulfonate (hereinafter referred to as "PSS"), polyaniline, and the like. In addition, an insulating high molecular compound is also effective in planarization of the anode, and polyimide (hereinafter referred to as "PI") is often used. Further, an inorganic compound is also used, which includes an ultrathin film of aluminum oxide (hereinafter referred to as "alumina") as well as a thin film of metal such as gold or platinum.

A material that is most widely used as the hole transporting material is an aromatic amine-based compound (in other words, a compound having a bond of benzene ring-nitrogen). A widely-used material includes 4,4'-bis(diphenylamino)-biphenyl (hereinafter referred to as "TAD"), a derivative thereof such as 4,4'-bis[N-(3-methylphenyl)-N-phenyl-amino]-biphenyl (hereinafter referred to as "TPD") or 4,4'-bis[N-(1-naphthyl)-N-phenyl-amino]-biphenyl (hereinafter referred to as "α-NPD"), and besides, a star burst aromatic amine compound such as 4,4', 4"-tris(N,N-diphenyl-amino)-triphenylamine (hereinafter referred to as "TDATA") or 4,4', 4"-tris [N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as Alq, BAlq, tris(4-methyl-8-quinolinolato)aluminum (hereinafter referred to as "Almq"), or bis(10-hydroxybenzo[h]-quinolinato)beryllium (hereinafter referred to as "BeBq"), and besides, a metal complex having an oxazole-based or a thiazole-based ligand such as bis[2-(2-hydroxyphenyl)-benzoxazolato]zinc (hereinafter referred to as "$Zn(BOX)_2$") or bis [2-(2-hydroxyphenyl)-benzothiazolato]zinc (hereinafter referred to as "$Zn(BTZ)_2$"). Further, other than the metal complex, an oxadiazole derivative such as 2-(4-biphenylyl)-5-(4-tert-butylphenyl)-1,3,4-oxadiazole (hereinafter referred to as "PBD") or OXD-7, a triazole derivative such as TAZ or 3-(4-tert-butylphenyl)-4-(4-ethylphenyl)-5-(4-biphenylyl)-1,2,4-triazole (hereinafter referred to as "p-EtTAZ"), and a phenanthroline derivative such as bathophenanthroline (hereinafter referred to as "BPhen") or BCP have an electron transporting property.

As the electron injecting material, the above-described electron transporting materials can be used. In addition, an ultrathin film of an insulator such as metal halide including calcium fluoride, lithium fluoride, cesium fluoride, and the like, or alkali metal oxide including lithium oxide, and the like is often used. Further, an alkali metal complex such as lithium acetyl acetonate (hereinafter referred to as "Li(acac)") or 8-quinolinolato-lithium (hereinafter referred to as "Liq") is also effective.

As the light emitting material, other than a metal complex such as Alq, Almq, BeBq, BAlq, $Zn(BOX)_2$, or $Zn(BTZ)_2$, various fluorescent pigments are effective. The fluorescent pigments include 4,4'-bis(2,2-diphenyl-vinyl)-biphenyl which is blue, 4-(dicyanomethylene)-2-methyl-6-(p-dimethylaminostyryl)-4H-pyran which is red-orange, and the like. In addition, a triplet light emitting material is also possible, which is mainly a complex with platinum or iridium as central metal. As the triplet light emitting material, tris(2-phenylpyridine)iridium, bis(2-(4'-tryl)pyridinato-N,$C^{2'}$) acetylacetonato iridium (hereinafter referred to as "acaclr $(tpy)_2$"), 2,3,7,8,12,13,17,18-octaethyl-21H,23H-porphyrin-platinum, and the like are known.

By combining the above-described materials that have respective functions, a highly reliable display element can be manufactured.

In addition, a display element having layers stacked in reverse order of that in FIG. 15A can be used by changing the polarity of a driving transistor having the pixel structure described in the above embodiment mode so as to be an N-channel transistor, and reversing the magnitude of a potential of an opposite electrode of a display element and a potential set to a power supply line. In other words, as shown in FIG. 15B, an element structure is such that the cathode 4408, the electron injecting layer 4407 formed of an electron injecting material, the electron transporting layer 4406 formed of an electron transporting material, the light emitting layer 4405, the hole transporting layer 4404 formed of a hole transporting material, the hole injecting layer 4403 formed of a hole injecting material, and the anode 4402 are sequentially stacked over the substrate 4401.

In addition, in order to extract light emission of a display element, at least one of the anode and the cathode may be transparent. Then, a TFT and a display element are formed over a substrate. There are display elements having a top emission structure in which light emission is extracted through the surface opposite to the substrate, having a bottom emission structure in which light emission is extracted through the surface on the substrate side, and having a dual emission structure in which light emission is extracted through the surface opposite to the substrate and the surface on the substrate side. The pixel structure described in the above embodiment mode can be applied to a display element having any of the emission structures.

A display element having the top emission structure is described with reference to FIG. 12A.

Over a substrate 4500, a driving TFT 4501 is formed with a base film 4505 interposed therebetween, and a first electrode 4502 is formed in contact with a source electrode of the driving TFT 4501. A layer 4503 containing an organic compound and a second electrode 4504 are formed thereover.

Note that the first electrode 4502 is an anode of the display element, and the second electrode 4504 is a cathode of the display element. In other words, the display element is formed in a region where the layer 4503 containing an organic compound is sandwiched between the first electrode 4502 and the second electrode 4504.

Here, the first electrode 4502 which functions as an anode is preferably formed using a material having a high work function. For example, a single-layer film such as a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and a titanium nitride film; or the like can be used. Note that when the first electrode 4502 has a stacked structure, it can have low resistance as a wiring, form a good ohmic contact, and function as an anode. By using a light-reflective metal film, an anode which does not transmit light can be formed.

The second electrode 4504 which functions as a cathode is preferably formed using a stacked layer of a metal thin film formed of a material having a low work function (Al, Ag, Li, Ca, or an alloy thereof such as MgAg, MgIn, AlLi, $CaF_2$, or calcium nitride) and a transparent conductive film (ITO (Indium Tin Oxide), indium zinc oxide (IZO), zinc oxide (ZnO), or the like). By using the thin metal film and the transparent conductive film as described above, a cathode which can transmit light can be formed.

Figure 12A:
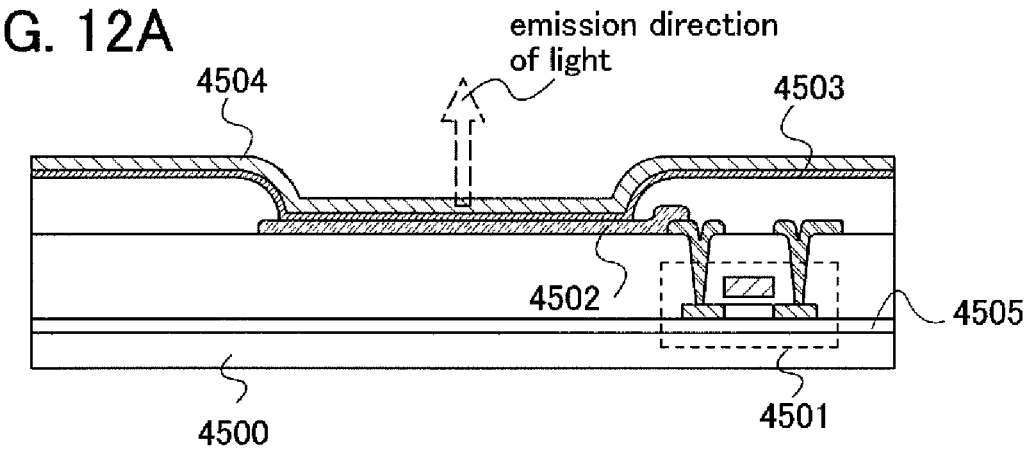
FIGS. 12A to 12C are diagrams each showing an example of a display device provided with a shift register of the present invention.

Thus, light of the display element can be extracted from a top surface as indicated by an arrow in FIG. 12A. In other words, in the case of applying the display element to the display panel shown in FIGS. 10A and 10B, light is emitted toward the sealing substrate 3604 side. Therefore, when a display element having the top emission structure is used for the display device, a substrate which transmits light is used as the sealing substrate 3604.

In addition, in the case of providing an optical film, the optical film may be provided over the sealing substrate 3604.

Next, a display element having the bottom emission structure is described with reference to FIG. 12B. Description is made using the same reference numerals as those in FIG. 12A since a structure except for its emission structure is identical.

Here, the first electrode 4502 which functions as an anode is preferably formed using a material having a high work function. For example, a transparent conductive film such as an ITO (Indium Tin Oxide) film or an indium zinc oxide (IZO) film can be used. By using a transparent conductive film, an anode which can transmit light can be formed.

The second electrode 4504 which functions as a cathode can be formed using a metal film formed of a material having a low work function (Al, Ag, Li, Ca, or an alloy thereof such as MgAg, MgIn, AlLi, $CaF_2$, or calcium nitride). By using a light-reflective metal film as described above, a cathode which does not transmit light can be formed.

Figure 12B:
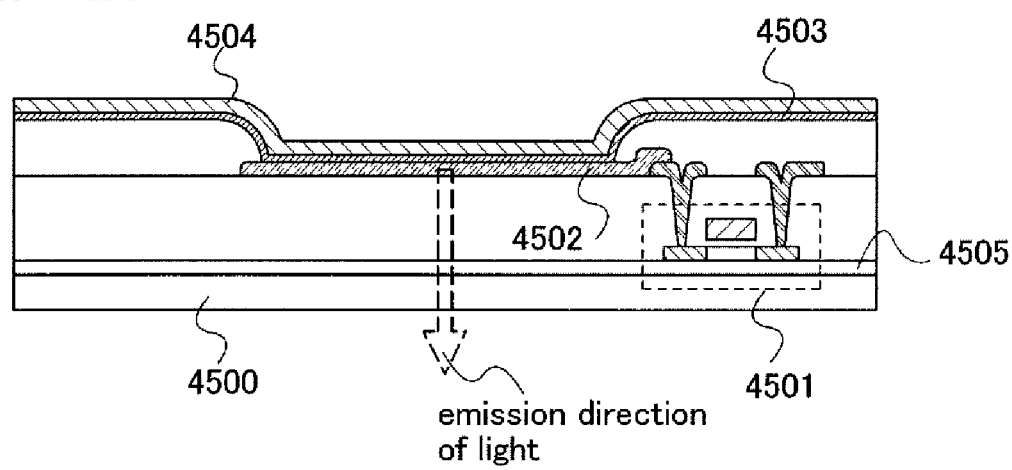

Thus, light of the display element can be extracted from a bottom surface as indicated by an arrow in FIG. 12B. In other words, in the case of applying the display element to the display panel shown in FIGS. 10A and 10B, light is emitted toward the substrate 3610 side. Therefore, when the display element having the bottom emission structure is used for the display device, a substrate which transmits light is used as the substrate 3610.

In addition, in the case of providing an optical film, the optical film may be provided over the substrate 3610.

Next, a display element having the dual emission structure is described with reference to FIG. 12C. Description is made using the same reference numerals as those in FIG. 12A since a structure except for its emission structure is identical.

Here, the first electrode 4502 which functions as an anode is preferably formed using a material having a high work function. For example, a transparent conductive film such as an ITO (Indium Tin Oxide) film or an indium zinc oxide (IZO) film can be used. By using a transparent conductive film, an anode which can transmit light can be formed.

The second electrode 4504 which functions as a cathode is preferably formed using a stacked layer of a metal thin film formed of a material having a low work function (Al, Ag, Li, Ca, or an alloy thereof such as MgAg, MgIn, AlLi, $CaF_2$, or calcium nitride) and a transparent conductive film (ITO (Indium Tin Oxide), an alloy of indium oxide and zinc oxide ($In_2O_3$—ZnO), zinc oxide (ZnO), or the like). By using the thin metal film and the transparent conductive film as described above, a cathode which can transmit light can be formed.

Figure 12C:
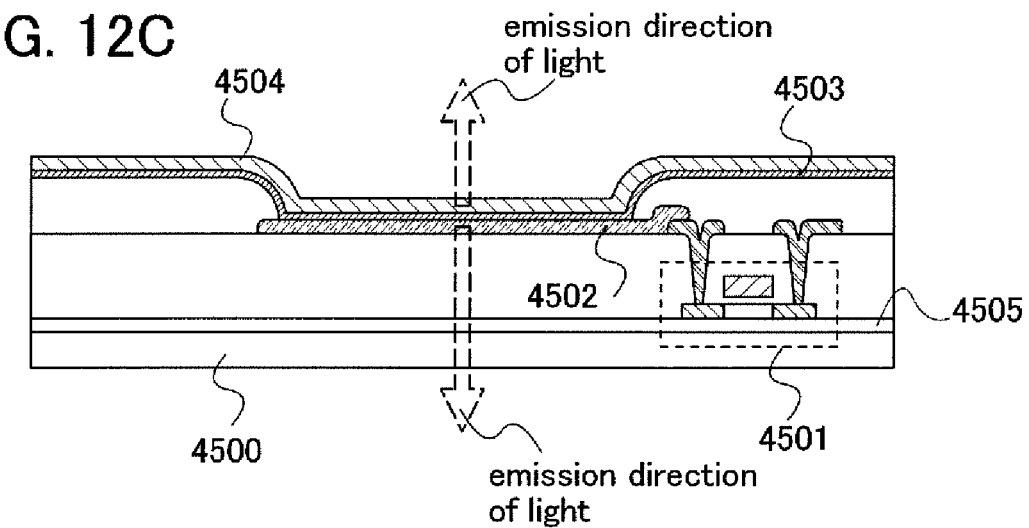

Thus, light of the display element can be extracted from both surfaces as indicated by arrows in FIG. 12C. In other words, in the case of applying the display element to the display panel shown in FIGS. 10A and 10B, light is emitted toward the substrate 3610 side and the sealing substrate 3604 side. Therefore, when the display element having the dual emission structure is used for the display device, substrates which transmit light are used as both the substrate 3610 and the sealing substrate 3604.

In addition, in the case of providing an optical film, the optical film may be provided over both the substrate 3610 and the sealing substrate 3604.

In addition, the present invention can be applied to a display device which achieves full-color display by using a white display element and a color filter.

Figure 13:
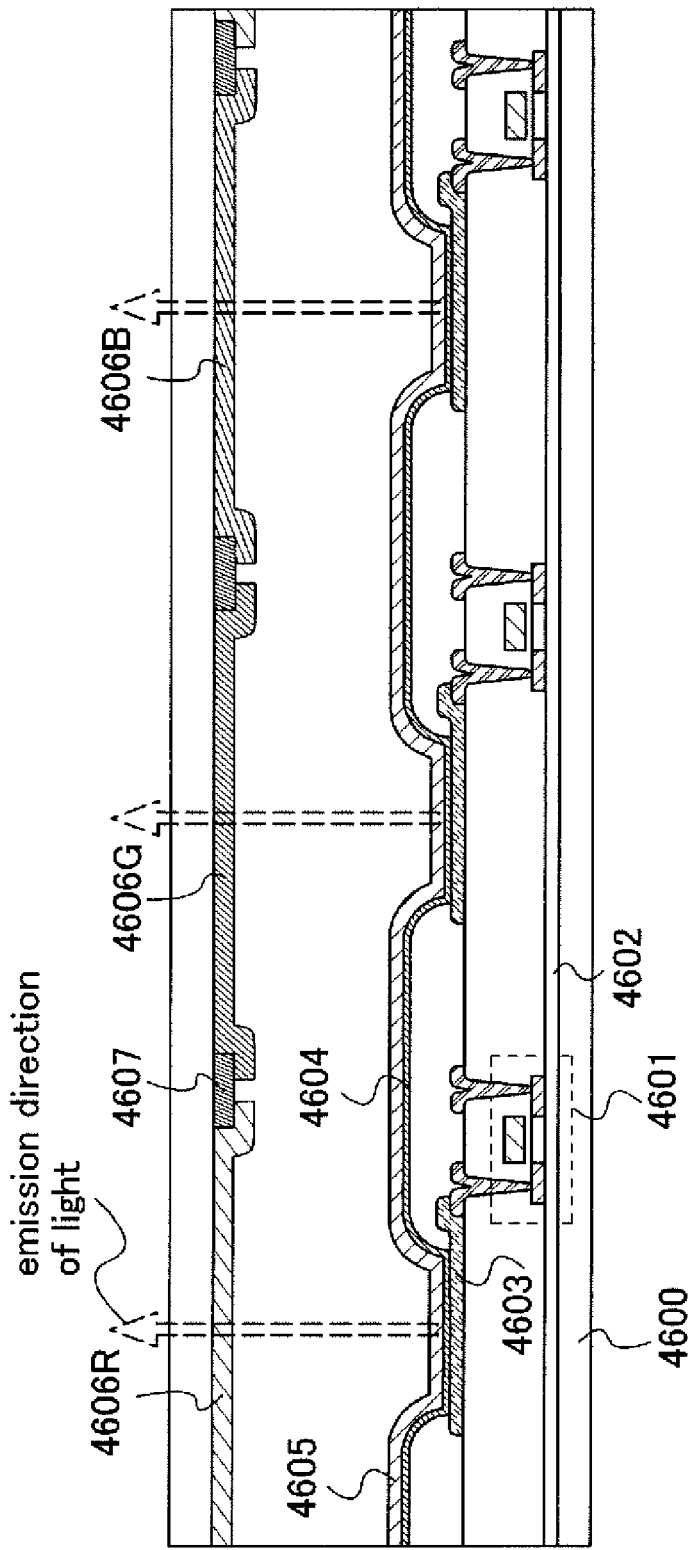
FIG. 13 is a diagram showing an example of a display device provided with a shift register of the present invention.

As shown in FIG. 13, for example, a structure can be formed in which a base film 4602 is formed over a substrate 4600, a driving TFT 4601 is formed thereover, and a first electrode 4603 is formed in contact with a source electrode of the driving TFT 4601. A layer 4604 containing an organic compound and a second electrode 4605 are formed thereover.

Note that the first electrode 4603 is an anode of the display element, and the second electrode 4605 is a cathode of the display element. In other words, the display element is formed in a region where the layer 4604 containing an organic compound is sandwiched between the first electrode 4603 and the second electrode 4605. In the structure shown in FIG. 13, white light is emitted. A red color filter 4606R, a green color filter 4606G, and a blue color filter 4606B are provided above each of the display elements to achieve full-color display. In addition, a black matrix (also referred to as a "BM") 4607 which separates these color filters is provided.

The above-described structures of the display element can be used in combination and can be appropriately used for the display device which is operated by the pulse output circuit or the shift register of the present invention. Note that the structures of the display panels and the display elements described above are merely examples, and needless to say, another structure can also be used.

Embodiment Mode 6

The present invention can be applied to various electronic devices. Specifically, it can be applied to the driving of a display portion of an electronic device. Examples of such an electronic device are as follows: a camera such as a video camera or a digital camera, a goggle type display, a navigation system, a sound reproducing device (such as a car audio or an audio component), a computer, a game machine, a portable information terminal (such as a mobile computer, a mobile phone, a portable game machine, or an e-book reader), an image reproducing device provided with a recording medium (specifically, a device which can reproduce a recording medium such as a digital versatile disc (DVD) and includes a light emitting device capable of displaying images thereof), and the like.

Figure 14A:
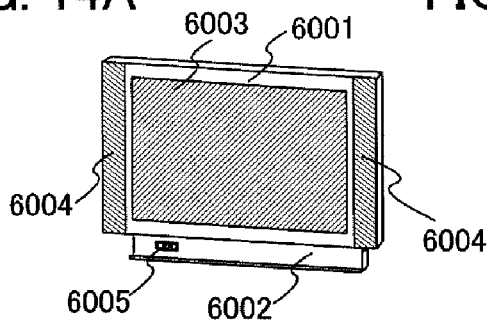
FIGS. 14A to 14H are diagrams each showing an example of an electronic device provided with a shift register of the present invention.

FIG. 14A shows a light emitting device, which includes a chassis 6001, a support 6002, a display portion 6003, speaker portions 6004, a video input terminal 6005, and the like. The display device of the present invention can be used for the display portion 6003. Note that the light emitting device includes any light emitting devices used for displaying information, for example, for a personal computer, for TV broadcast reception, or for advertisement display. The shift register of the present invention is used to drive the display portion 6003, so that power consumption can be reduced.

Figure 14B:
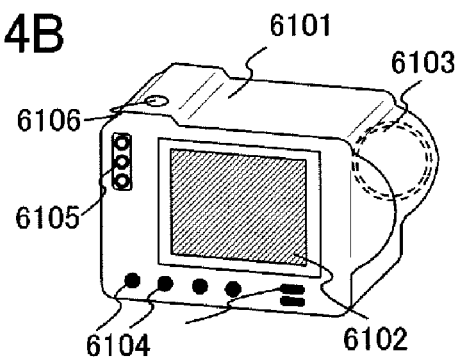

FIG. 14B shows a camera, which includes a main body 6101, a display portion 6102, an image receiving portion 6103, operation keys 6104, an external connection port 6105, a shutter button 6106, and the like. The shift register of the present invention is used to drive the display portion 6102, so that power consumption can be reduced.

Figure 14C:
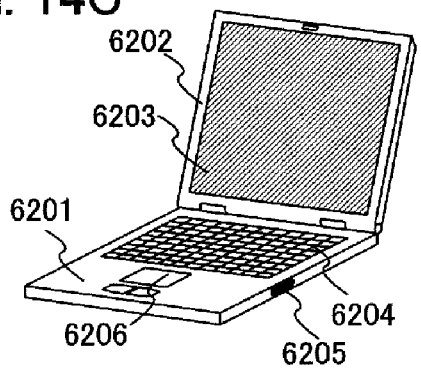

FIG. 14C shows a computer, which includes a main body 6201, a chassis 6202, a display portion 6203, a keyboard 6204, an external connection port 6205, a pointing device 6206, and the like. The shift register of the present invention is used to drive the display portion 6203, so that power consumption can be reduced.

Figure 14D:
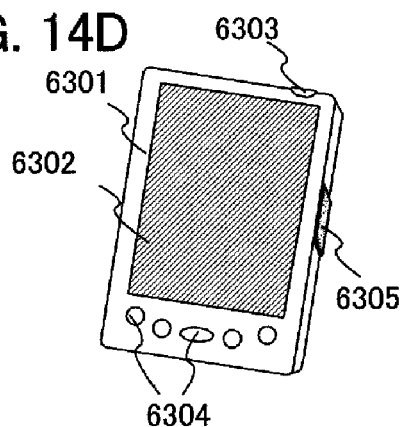

FIG. 14D shows a mobile computer, which includes a main body 6301, a display portion 6302, a switch 6303, operation keys 6304, an infrared port 6305, and the like. The shift register of the present invention is used to drive the display portion 6302, so that power consumption can be reduced.

Figure 14E:
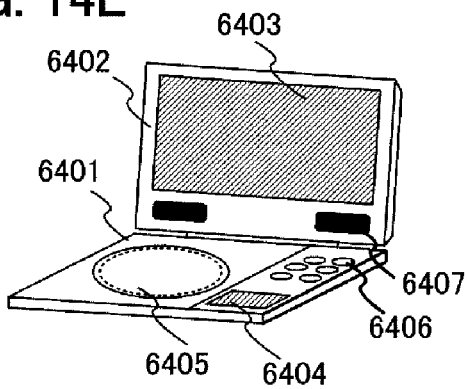

FIG. 14E shows a portable image reproducing device provided with a recording medium (specifically, a DVD reproducing device), which includes a main body 6401, a chassis 6402, a display portion A 6403, a display portion B 6404, a recording medium (DVD or the like) reading portion 6405, an operation key 6406, a speaker portion 6407, and the like. The display portion A 6403 mainly displays image information, and the display portion B 6404 mainly displays character information. The shift register of the present invention is used to drive the display portion A 6403 and the display portion B 6404, so that power consumption can be reduced.

Figure 14F:
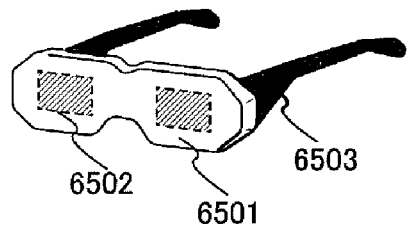

FIG. 14F shows a goggle type display, which includes a main body 6501, a display portion 6502, an arm portion 6503, and the like. The shift register of the present invention is used to drive the display portion 6502, so that power consumption can be reduced.

Figure 14G:
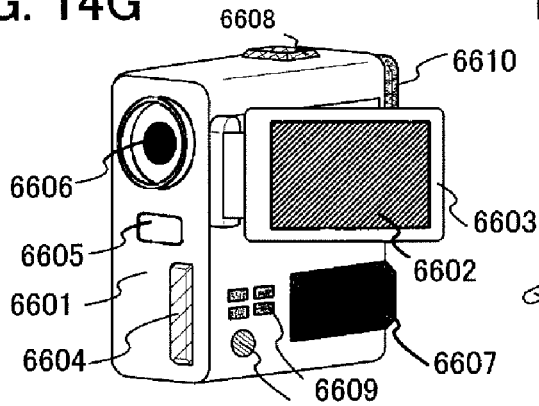

FIG. 14G shows a video camera, which includes a main body 6601, a display portion 6602, a chassis 6603, an external connection port 6604, a remote control receiving portion 6605, an image receiving portion 6606, a battery 6607, an audio input portion 6608, operation keys 6609, an eyepiece portion 6610, and the like. The shift register of the present invention is used to drive the display portion 6602, so that power consumption can be reduced.

Figure 14H:
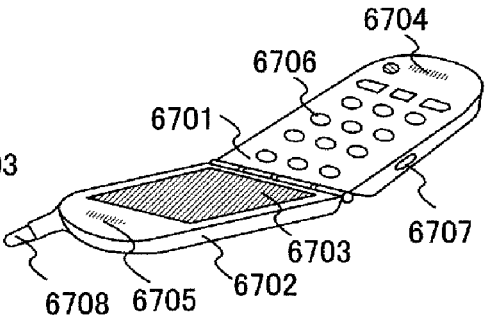

FIG. 14H shows a mobile phone, which includes a main body 6701, a chassis 6702, a display portion 6703, an audio input portion 6704, an audio output portion 6705, an operation key 6706, an external connection port 6707, an antenna 6708, and the like. The shift register of the present invention is used to drive the display portion 6703, so that power consumption can be reduced.

As described above, the present invention can be applied to various electronic devices.

This application is based on Japanese Patent Application serial No. 2006-282931 filed in Japan Patent Office on Oct. 17, 2006, the entire contents of which are hereby incorporated by reference.

What is claimed is:

1. A pulse output circuit comprising:
first to ninth transistors;
first to sixth input terminals; and
an output terminal,
wherein the pulse output circuit is electrically connected to first to fifth power supply lines,
wherein a first electrode of the first transistor is electrically connected to the first power supply line, a second electrode of the first transistor is electrically connected to a gate electrode of the third transistor, and a gate electrode of the first transistor is electrically connected to the fourth input terminal,
wherein a first electrode of the second transistor is electrically connected to the second power supply line, a second electrode of the second transistor is electrically connected to the gate electrode of the third transistor, and a gate electrode of the second transistor is electrically connected to a gate electrode of the fourth transistor,
wherein a first electrode of the third transistor is electrically connected to the first input terminal and a second electrode of the third transistor is electrically connected to the output terminal,
wherein a first electrode of the fourth transistor is electrically connected to the third power supply line and a second electrode of the fourth transistor is electrically connected to the output terminal,
wherein a first electrode of the fifth transistor is electrically connected to the fourth power supply line, a second electrode of the fifth transistor is electrically connected to the gate electrode of the second transistor and the gate electrode of the fourth transistor, and a gate electrode of the fifth transistor is electrically connected to the fourth input terminal,
wherein a first electrode of the sixth transistor is electrically connected to the fourth power supply line, a second electrode of the sixth transistor is electrically connected to the gate electrode of the second transistor and the gate electrode of the fourth transistor, and a gate electrode of the sixth transistor is electrically connected to the fifth input terminal,
wherein a first electrode of the seventh transistor is electrically connected to the fifth power supply line, a second electrode of the seventh transistor is electrically connected to the gate electrode of the second transistor and the gate electrode of the fourth transistor, and a gate electrode of the seventh transistor is electrically connected to the sixth input terminal,
wherein a first electrode of the eighth transistor is electrically connected to the fifth power supply line, a second electrode of the eighth transistor is electrically connected to a second electrode of the ninth transistor, and a gate electrode of the eighth transistor is electrically connected to the second input terminal, and
wherein a first electrode of the ninth transistor is electrically connected to the gate electrode of the second transistor and the gate electrode of the fourth transistor, and a gate electrode of the ninth transistor is electrically connected to the third input terminal.

2. The pulse output circuit according to claim 1, wherein a capacitor is provided between the second electrode of the third transistor and the gate electrode of the third transistor.

3. The pulse output circuit according to claim 1, wherein a potential of the first power supply line and a potential of the fifth power supply line are higher than a potential of the second power supply line, a potential of the third power supply line, a potential of the fourth power supply line, and a potential of the sixth power supply line.

4. The pulse output circuit according to claim 3, wherein the potential of the fifth power supply line is lower than the potential of the first power supply line.

5. The pulse output circuit according to claim 1, wherein the first to ninth transistors comprises amorphous silicon.

6. The shift register according to claim 5,
wherein each of the pulse output circuits comprises first to ninth transistors,
wherein each of the pulse output circuits is electrically connected to first to fifth power supply lines,
wherein a first electrode of the first transistor is electrically connected to the first power supply line, a second electrode of the first transistor is electrically connected to a gate electrode of the third transistor, and a gate electrode of the first transistor is electrically connected to the fourth input terminal,
wherein a first electrode of the second transistor is electrically connected to the second power supply line, a second electrode of the second transistor is electrically connected to the gate electrode of the third transistor, and a gate electrode of the second transistor is electrically connected to a gate electrode of the fourth transistor,
wherein a first electrode of the third transistor is electrically connected to the first input terminal and a second electrode of the third transistor is electrically connected to the output terminal,
wherein a first electrode of the fourth transistor is electrically connected to the third power supply line and a second electrode of the fourth transistor is electrically connected to the output terminal,
wherein a first electrode of the fifth transistor is electrically connected to the fourth power supply line, a second electrode of the fifth transistor is electrically connected to the gate electrode of the second transistor and the gate electrode of the fourth transistor, and a gate electrode of the fifth transistor is electrically connected to the fourth input terminal,
wherein a first electrode of the sixth transistor is electrically connected to the fourth power supply line, a second electrode of the sixth transistor is electrically connected to the gate electrode of the second transistor and the gate electrode of the fourth transistor, and a gate electrode of the sixth transistor is electrically connected to the fifth input terminal,
wherein a first electrode of the seventh transistor is electrically connected to the fifth power supply line, a second electrode of the seventh transistor is electrically connected to the gate electrode of the second transistor and the gate electrode of the fourth transistor, and a gate electrode of the seventh transistor is electrically connected to the sixth input terminal,
wherein a first electrode of the eighth transistor is electrically connected to the fifth power supply line, a second electrode of the eighth transistor is electrically connected to a second electrode of the ninth transistor, and a gate electrode of the eighth transistor is electrically connected to the second input terminal, and
wherein a first electrode of the ninth transistor is electrically connected to the gate electrode of the second transistor and the gate electrode of the fourth transistor, and a gate electrode of the ninth transistor is electrically connected to the third input terminal.

7. The pulse output circuit according to claim 1, wherein each of the first to ninth transistors is an N-channel thin film transistor.

8. The pulse output circuit according to claim 1, further comprising a tenth transistor, an eleventh transistor, a twelfth transistor, and a thirteenth transistor:
wherein a gate electrode of the tenth transistor is connected to the second electrode of the first transistor, a first electrode of the tenth transistor is connected to the first input terminal, a second electrode of the tenth transistor is connected to a second output terminal,
wherein a gate electrode of the eleventh transistor is connected to the gate electrode of the second transistor and the gate electrode of the fourth transistor, a first electrode of the eleventh transistor is connected to an eighth power supply line, and a second electrode of the eleventh transistor is connected to the second output terminal,
wherein a gate electrode of the twelfth transistor is connected to the gate electrode of the ninth transistor, a first electrode of the twelfth transistor is connected to a ninth power supply line, and a second electrode of the twelfth transistor is connected to the second output terminal, and
wherein a gate electrode of the thirteenth transistor is connected to the gate electrode of the ninth transistor, a first electrode of the thirteenth transistor is connected to a seventh power supply line, and a second electrode of the thirteenth transistor is connected to the output terminal which is a first output terminal.

9. The pulse output circuit according to claim 8, further comprising a capacitor,
wherein a first electrode of the capacitor is connected to the second output terminal, and a second electrode of the capacitor is connected to the gate electrode of the tenth transistor and the second electrode of the first transistor.

10. A pulse output circuit comprising:
first to ninth transistors;
a first capacitor;
first to sixth input terminals; and
an output terminal,
wherein the pulse output circuit is electrically connected to first to sixth power supply lines,
wherein a first electrode of the first transistor is electrically connected to the first power supply line, a second electrode of the first transistor is electrically connected to a gate electrode of the third transistor, and a gate electrode of the first transistor is electrically connected to the fourth input terminal,
wherein a first electrode of the second transistor is electrically connected to the second power supply line, a second electrode of the second transistor is electrically connected to the gate electrode of the third transistor, and a gate electrode of the second transistor is electrically connected to a gate electrode of the fourth transistor,
wherein a first electrode of the third transistor is electrically connected to the first input terminal and a second electrode of the third transistor is electrically connected to the output terminal,
wherein a first electrode of the fourth transistor is electrically connected to the third power supply line and a second electrode of the fourth transistor is electrically connected to the output terminal,
wherein a first electrode of the fifth transistor is electrically connected to the fourth power supply line, a second electrode of the fifth transistor is electrically connected to the gate electrode of the second transistor and the gate electrode of the fourth transistor, and a gate electrode of the fifth transistor is electrically connected to the fourth input terminal,
wherein a first electrode of the sixth transistor is electrically connected to the fourth power supply line, a second electrode of the sixth transistor is electrically connected to the gate electrode of the second transistor and the gate electrode of the fourth transistor, and a gate electrode of the sixth transistor is electrically connected to the fifth input terminal, wherein a first electrode of the seventh transistor is electrically connected to the fifth power supply line, a second electrode of the seventh transistor is electrically connected to the gate electrode of the second transistor and the gate electrode of the fourth transistor, and a gate electrode of the seventh transistor is electrically connected to the sixth input terminal, wherein a first electrode of the eighth transistor is electrically connected to the fifth power supply line, a second electrode of the eighth transistor is electrically connected to a second electrode of the ninth transistor, and a gate electrode of the eighth transistor is electrically connected to the second input terminal, wherein a first electrode of the ninth transistor is electrically connected to the gate electrode of the second transistor and the gate electrode of the fourth transistor, and a gate electrode of the ninth transistor is electrically connected to the third input terminal, and wherein a first electrode of the first capacitor is electrically connected to the sixth power supply line, and a second electrode of the first capacitor is electrically connected to the gate electrode of the second transistor and the gate electrode of the fourth transistor.

11. The pulse output circuit according to claim 10, wherein a second capacitor is provided between the second electrode of the third transistor and the gate electrode of the third transistor.

12. The pulse output circuit according to claim 10, wherein a potential of the first power supply line and a potential of the fifth power supply line are higher than a potential of the second power supply line, a potential of the third power supply line, a potential of the fourth power supply line, and a potential of the sixth power supply line.

13. The pulse output circuit according to claim 12, wherein the potential of the fifth power supply line is lower than the potential of the first power supply line.

14. The pulse output circuit according to claim 10, wherein the first to ninth transistors comprises amorphous silicon.

15. A shift register comprising:
a plurality of pulse output circuits comprising a (m−2)th pulse output circuit, a (m−1)th pulse output circuit, an m-th pulse output circuit, a (m+1)th pulse output circuit, and a (m+2)th pulse output circuit (m≧3); and
first to fourth signal lines each of which is configured to output a clock signal,
wherein each of the pulse output circuits comprises first to sixth input terminals and an output terminal,
wherein the first to third input terminals of the m-th pulse output circuit are electrically connected to three different signal lines among the first to fourth signal lines,
wherein the fourth input terminal of the m-th pulse output circuit is electrically connected to the output terminal of the (m−2)th pulse output circuit,
wherein the fifth input terminal of the m-th pulse output circuit is electrically connected to the output terminal of the (m−1)th pulse output circuit,
wherein the sixth input terminal of the m-th pulse output circuit is electrically connected to the output terminal of the (m+2)th pulse output circuit, and
wherein the output terminal of the m-th pulse output circuit is electrically connected to the sixth input terminal of the (m−2)th pulse output circuit, the fifth input terminal of the (m+1)th pulse output circuit, and the fourth input terminal of the (m+2)th pulse output circuit.

16. The shift register according to claim 15,
wherein one signal line of the first to fourth signal lines is configured to output a first clock signal, and
wherein one of the other ones of the first to fourth signal lines is configured to output a second clock signal which is delayed by ½ period.

17. A semiconductor device comprising the shift register according to claim 15.

18. An electronic device having the semiconductor device according to claim 17, wherein the electronic device is selected from the group consisting of a light emitting device, a camera, a computer, a mobile computer, a portable image reproducing device, and a goggle type display.

19. The shift register according to claim 15, wherein each of the first to fourth signal lines is configured to output a clock signal which is delayed by ½ period sequentially.

20. A display device comprising:
a pixel; and
a shift register configured to drive the pixel,
herein the shift register comprises:
a plurality of pulse output circuits comprising a (m−2)th pulse output circuit, a (m−1)th pulse output circuit, an m-th pulse output circuit, a (m+1)th pulse output circuit, and a (m+2)th pulse output circuit (m≧3); and
first to fourth signal lines each of which is configured to output a clock signal,
wherein each of the pulse output circuits comprises first to sixth input terminals and an output terminal,
wherein the first to third input terminals of the m-th pulse output circuit are electrically connected to three different signal lines among the first to fourth signal lines,
wherein the fourth input terminal of the m-th pulse output circuit is electrically connected to the output terminal of the (m−2)th pulse output circuit,
wherein the fifth input terminal of the m-th pulse output circuit is electrically connected to the output terminal of the (m−1)th pulse output circuit,
wherein the sixth input terminal of the m-th pulse output circuit is electrically connected to the output terminal of the (m+2)th pulse output circuit, and
wherein the output terminal of the m-th pulse output circuit is electrically connected to the sixth input terminal of the (m−2)th pulse output circuit, the fifth input terminal of the (m+1)th pulse output circuit, and the fourth input terminal of the (m+2)th pulse output circuit.

21. The display device according to claim 20,
wherein one signal line of the first to fourth signal lines is configured to output a first clock signal, and
wherein one of the other ones of the first to fourth signal lines is configured to output a second clock signal which is delayed by ½ period.

22. The display device according to claim 20,
wherein each of the pulse output circuits comprises first to ninth transistors,
wherein each of the pulse output circuits is electrically connected to first to fifth power supply lines,
wherein a first electrode of the first transistor is electrically connected to the first power supply line, a second electrode of the first transistor is electrically connected to a gate electrode of the third transistor, and a gate electrode of the first transistor is electrically connected to the fourth input terminal,
wherein a first electrode of the second transistor is electrically connected to the second power supply line, a second electrode of the second transistor is electrically connected to the gate electrode of the third transistor, and a gate electrode of the second transistor is electrically connected to a gate electrode of the fourth transistor, wherein a first electrode of the third transistor is electrically connected to the first input terminal and a second electrode of the third transistor is electrically connected to the output terminal, wherein a first electrode of the fourth transistor is electrically connected to the third power supply line and a second electrode of the fourth transistor is electrically connected to the output terminal, wherein a first electrode of the fifth transistor is electrically connected to the fourth power supply line, a second electrode of the fifth transistor is electrically connected to the gate electrode of the second transistor and the gate electrode of the fourth transistor, and a gate electrode of the fifth transistor is electrically connected to the fourth input terminal, wherein a first electrode of the sixth transistor is electrically connected to the fourth power supply line, a second electrode of the sixth transistor is electrically connected to the gate electrode of the second transistor and the gate electrode of the fourth transistor, and a gate electrode of the sixth transistor is electrically connected to the fifth input terminal, wherein a first electrode of the seventh transistor is electrically connected to the fifth power supply line, a second electrode of the seventh transistor is electrically connected to the gate electrode of the second transistor and the gate electrode of the fourth transistor, and a gate electrode of the seventh transistor is electrically connected to the sixth input terminal, wherein a first electrode of the eighth transistor is electrically connected to the fifth power supply line, a second electrode of the eighth transistor is electrically connected to a second electrode of the ninth transistor, and a gate electrode of the eighth transistor is electrically connected to the second input terminal, and wherein a first electrode of the ninth transistor is electrically connected to the gate electrode of the second transistor and the gate electrode of the fourth transistor, and a gate electrode of the ninth transistor is electrically connected to the third input terminal.

23. An electronic device having the display device according to claim 19, wherein the electronic device is selected from the group consisting of a light emitting device, a camera, a computer, a mobile computer, a portable image reproducing device, and a goggle type display.

24. The display device according to claim 20, wherein each of the first to fourth signal lines is configured to output a clock signal which is delayed by ½ period sequentially.

* * * * *

UNITED STATES PATENT AND TRADEMARK OFFICE
CERTIFICATE OF CORRECTION

PATENT NO. : 7,932,888 B2
APPLICATION NO. : 11/871704
DATED : April 26, 2011
INVENTOR(S) : Hiroyuki Miyake It is certified that error appears in the above-identified patent and that said Letters Patent is hereby corrected as shown below:

In the Specification

Column 2, line 53, after "node" replace "y" with --$Y$--;

Column 6, line 61, replace "104" with --$10_4$--;

Column 7, line 5, replace "103" with --$10_3$--;

In the Claims

Column 28, line 18, in claim 23 replace "19" with --20--.

Signed and Sealed this
Fifth Day of November, 2013

Teresa Stanek Rea
*Deputy Director of the United States Patent and Trademark Office*